United States Patent
Takahashi et al.

[11] Patent Number: 6,097,537
[45] Date of Patent: Aug. 1, 2000

[54] CATADIOPTRIC OPTICAL SYSTEM

[75] Inventors: Tomowaki Takahashi; Junichi Misawa, both of Yokohama, Japan

[73] Assignee: Nikon Corporation, Tokyo, Japan

[21] Appl. No.: 09/286,376

[22] Filed: Apr. 5, 1999

[30] Foreign Application Priority Data

Apr. 7, 1998 [JP] Japan .................................. 10-111508
Apr. 7, 1998 [JP] Japan .................................. 10-111509

[51] Int. Cl.$^7$ .................................................. G02B 17/00
[52] U.S. Cl. ............................................ 359/364; 359/727
[58] Field of Search .................................. 359/364, 365, 359/366, 727, 728, 730

[56] References Cited

U.S. PATENT DOCUMENTS

| | | |
|---|---|---|
| 4,779,966 | 10/1988 | Friedman . |
| 5,289,312 | 2/1994 | Hashimoto et al. ................... 359/487 |
| 5,323,263 | 6/1994 | Schoenmakers .......................... 359/366 |
| 5,689,377 | 11/1997 | Takahashi ................................ 359/727 |
| 5,691,802 | 11/1997 | Takahashi .................................. 355/53 |
| 5,835,275 | 2/1994 | Takahashi et al. ...................... 359/629 |

*Primary Examiner*—Cassandra Spyrou
*Assistant Examiner*—Mark A. Robinson
*Attorney, Agent, or Firm*—Oliff & Berridge, PLC

[57] ABSTRACT

A catadioptric optical system (10, 110) capable of forming an image of an object. The system comprises a first optical axis ($Z_1$) having a first end (12) and a second end (14), with a concave mirror ($M_C$) arranged at the first end. A second surface ($P_2$) orthogonal to the first optical axis is provided at the second end. A reflective surface (M) is arranged between the concave mirror and the second surface. A first imaging optical system (A) comprising a first plurality of lenses ($L_1$–$L_4$) is arranged between the reflective surface and the concave mirror. A second imaging optical system (B) comprising a second plurality of lenses ($L_5$–$L_9$) is arranged between the reflective surface and the second surface. The system further includes a second optical axis ($Z_2$) intersecting the first optical axis at the reflective surface and having a first surface ($P_1$) disposed along and orthogonal to the secondary optical axis. The first surface is divided into first and second regions (30 and 32) by a line of intersection $Q_1$, between the first surface and a plane containing the first optical axis and the second optical axis. The object is arranged in one of the first and second regions of the first surface. The image is formed in one of first and second regions (36 and 38) of the second surface formed by a line of intersection $Q_2$ between the second surface and a plane containing the first optical axis and the second optical axis. Alternatively, the first and second regions of the first and second surface are formed by a line of intersection between the first and second surface and a plane orthogonal to the first optical axis that includes the second optical axis. Also, an intermediate image (C) of the object is formed in the vicinity of the reflective surface. The system also preferably satisfies a number of design conditions.

13 Claims, 15 Drawing Sheets

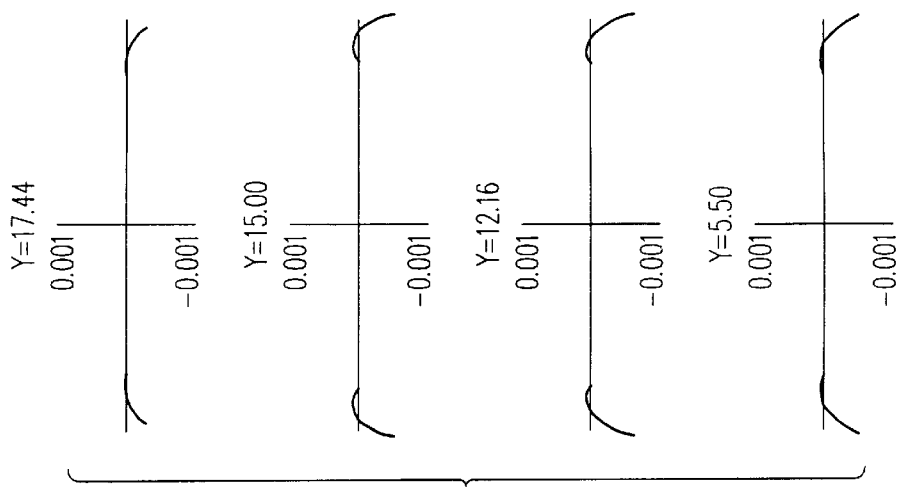
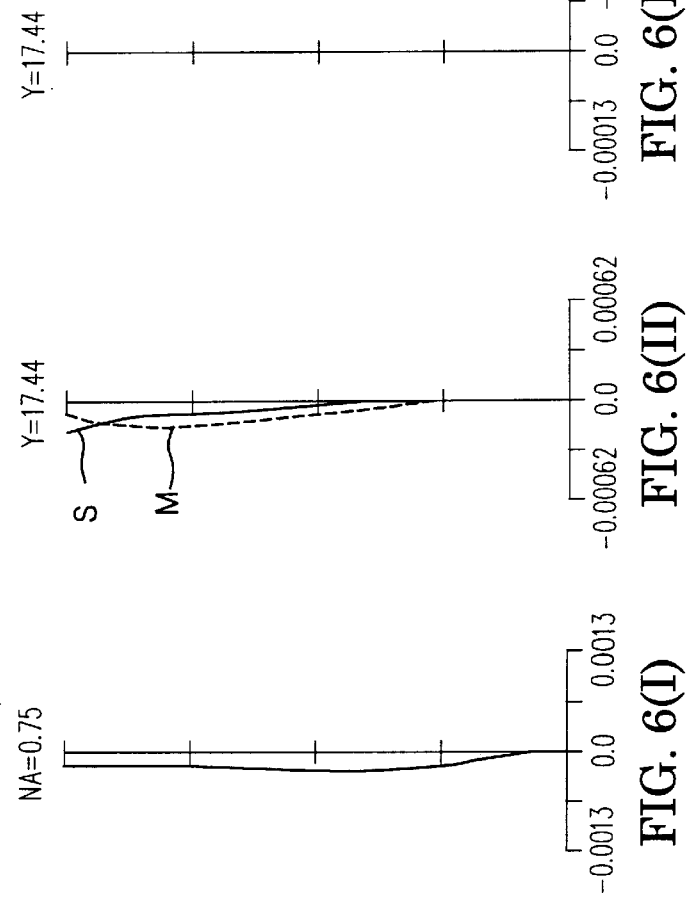
FIG. 6(IV)
FIG. 6(III)
FIG. 6(II)
FIG. 6(I)

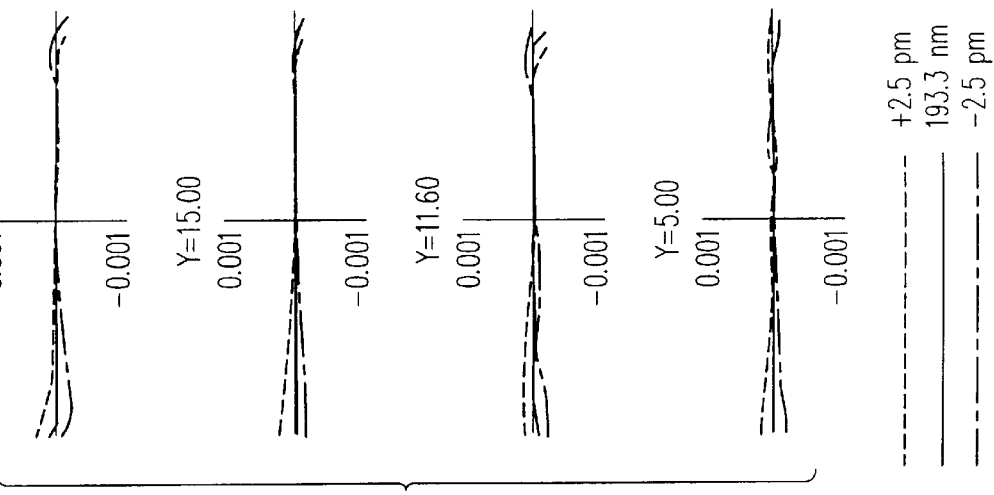
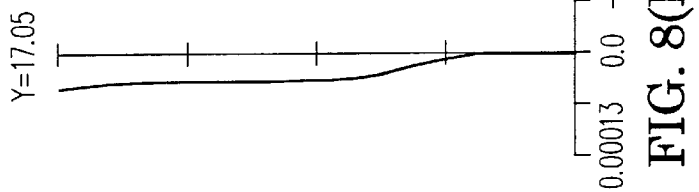
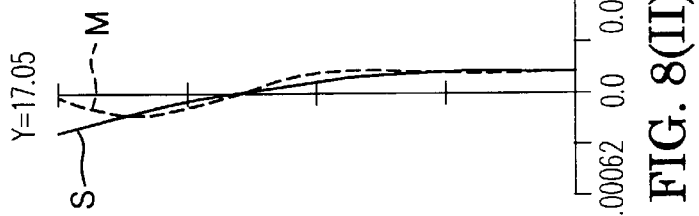
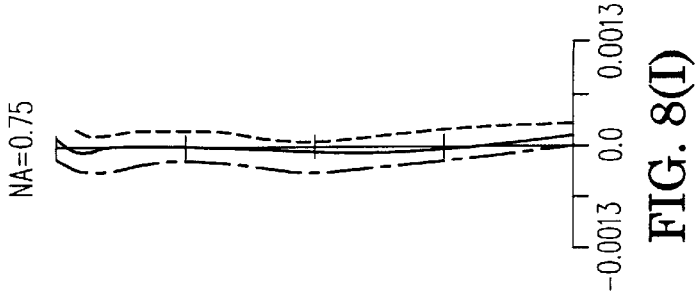
FIG. 8(I)   FIG. 8(II)   FIG. 8(III)   FIG. 8(IV)

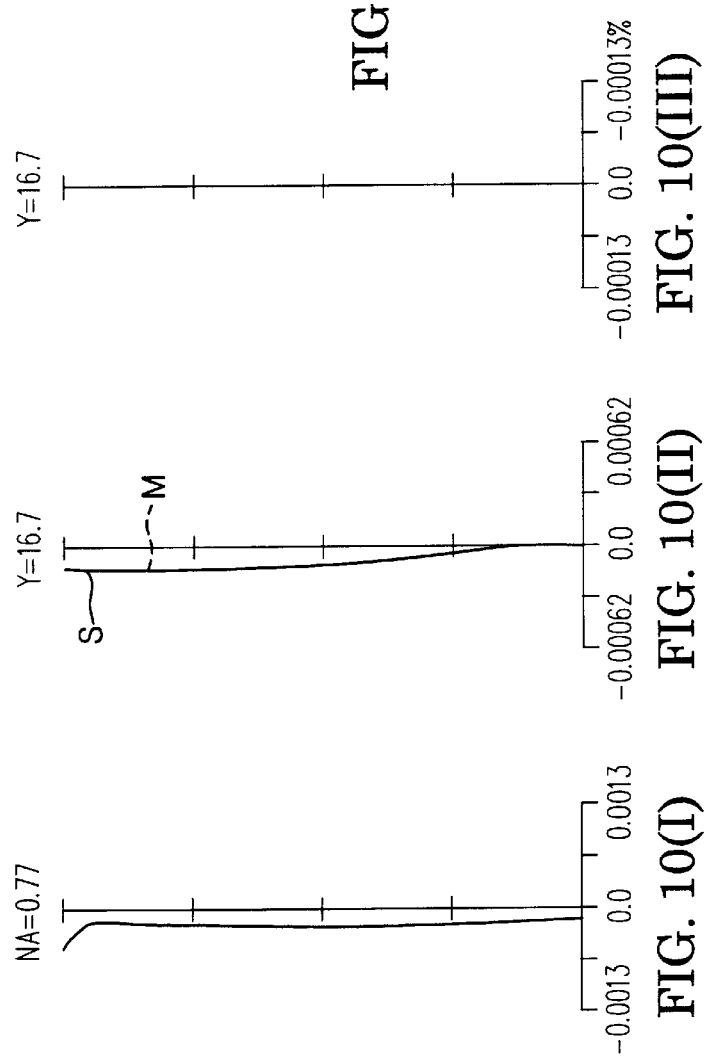
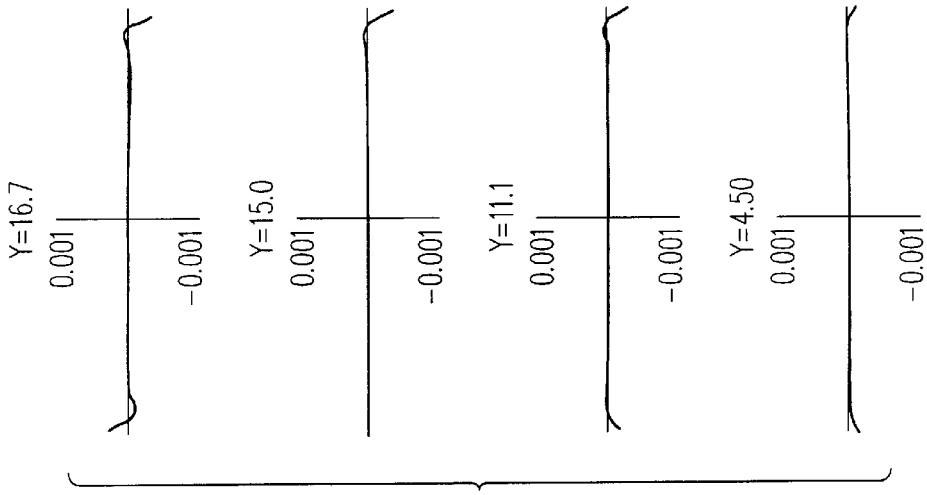
FIG. 10(I)
FIG. 10(II)
FIG. 10(III)
FIG. 10(IV)

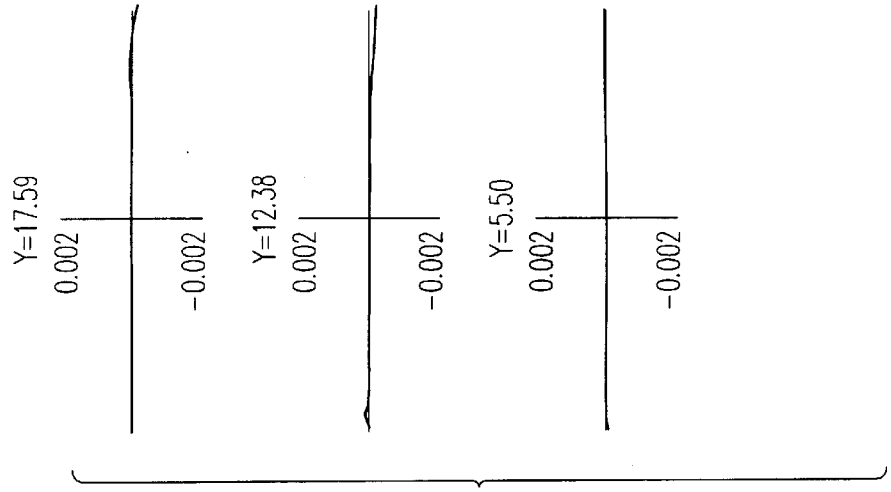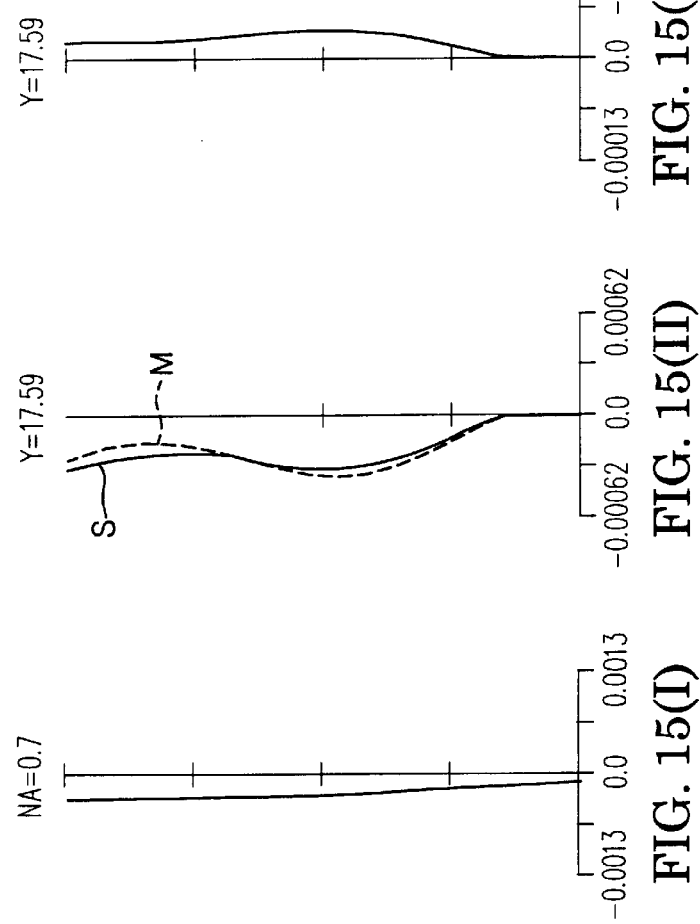

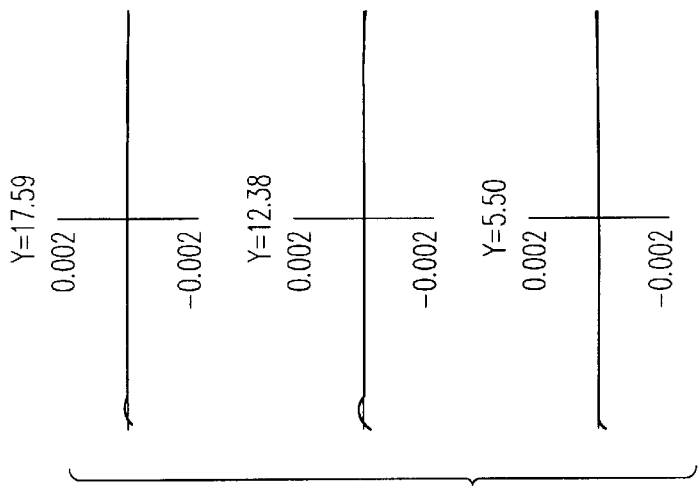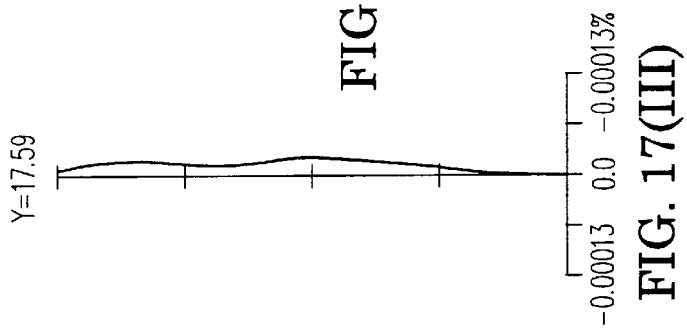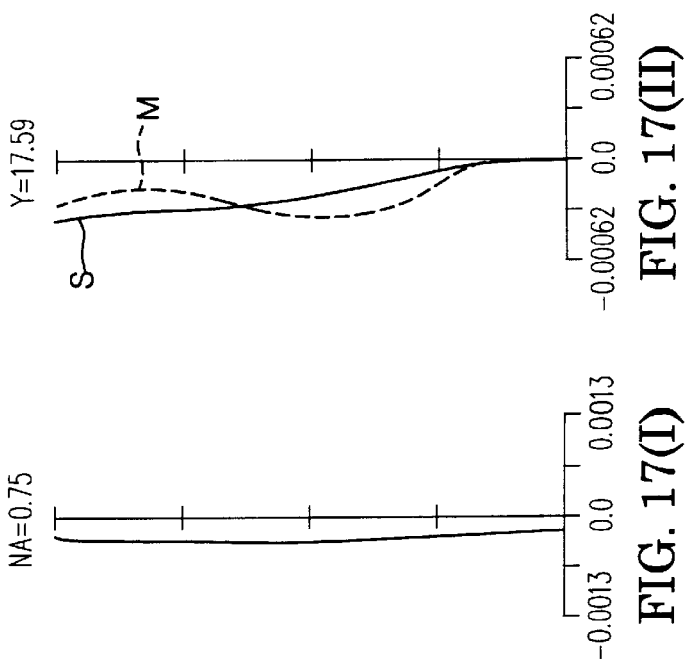

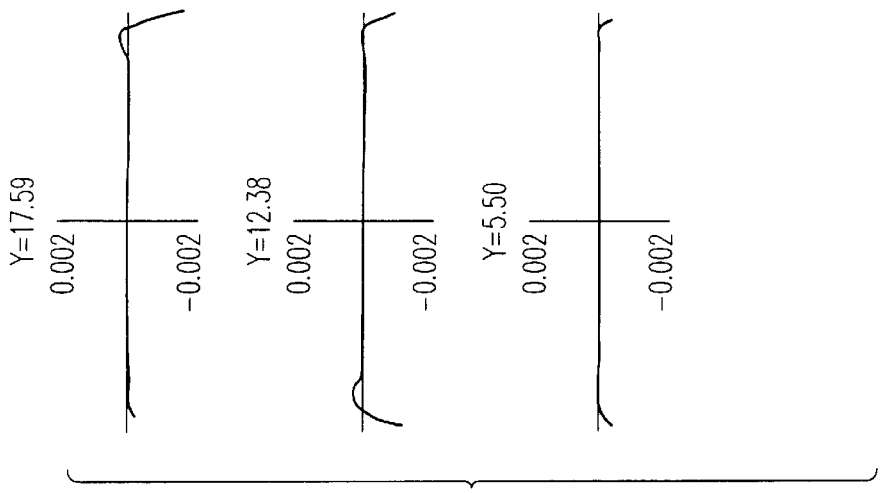
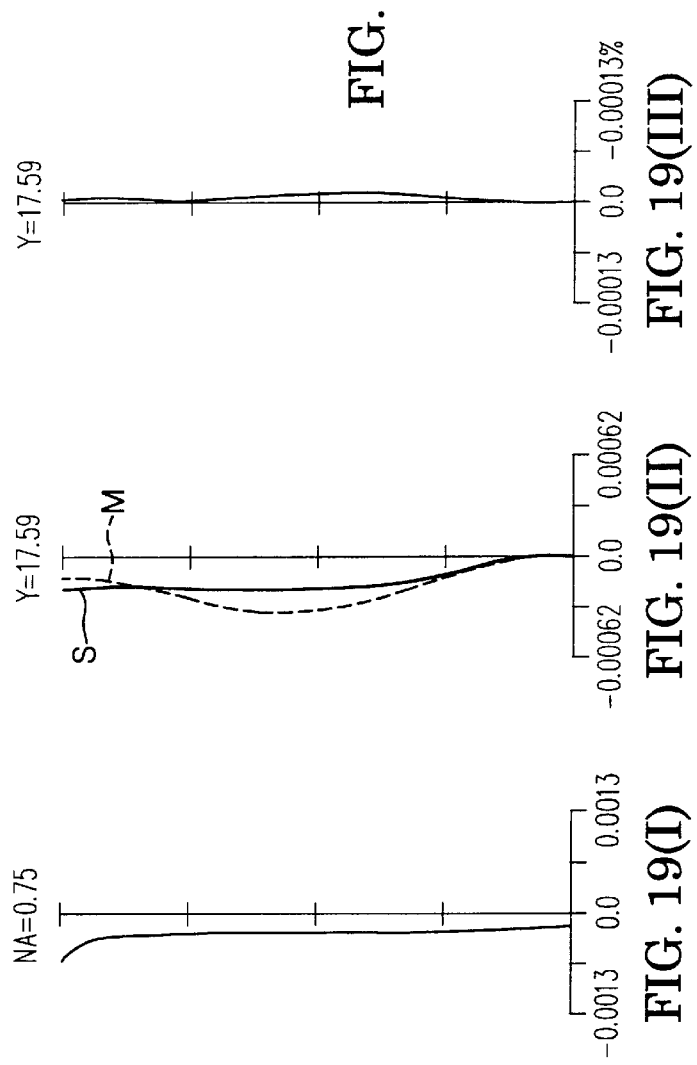

CATADIOPTRIC OPTICAL SYSTEM

FIELD OF THE INVENTION

The present invention relates to the optical system of a reduction exposure apparatus such as a stepper used principally in the manufacture of semiconductors, and more particularly relates to an approximately ¼× catadioptric reduction optical system having submicron resolution in the ultraviolet wavelength region.

BACKGROUND OF THE INVENTION

The circuit patterns of semiconductors have been increasingly miniaturized in recent years, and there has been a demand for higher resolving power in exposure apparatuses that print these patterns. To satisfy this demand, the wavelength of the light source must be made shorter and the NA (numerical aperture) of the optical system (i.e., projection lens) must be made larger. Nevertheless, the types of optical glass that can withstand practical use are limited due to the absorption of light as the wavelength shortens. Once the wavelength falls below 180 nm, the only usable glass, for practical purposes, is fluorite.

However, it is impossible to correct chromatic aberration if the optical system is a refractive (i.e., dioptric) optical system with only one type of glass. Accordingly, it is extremely difficult to build a dioptric optical system having the required resolving power. Therefore, a variety of proposals have been made for a catadioptric reduction optical system, i.e., one that combines a reflective system with a refractive system comprising optical glass that can be used at the working wavelength.

Certain of the proposed optical systems form an intermediate image one or more times midway in the optical system. Others form an intermediate image just once, such at those systems disclosed in Japanese Patent Application Kokoku No. Hei 5-25170, Japanese Patent Application Kokai No. Sho 63-163319, Japanese Patent Application Kokai No. Hei 4-234722 and U.S. Pat. No. 4,779,966.

Among the abovementioned prior art, the optical systems having just one concave mirror include those disclosed in Japanese Patent Application Kokai No. Hei 4-234722 and U.S. Pat. No. 4,779,966. These optical systems employ only negative lenses in the round-trip combination optical system which includes the concave mirror, and do not use optical systems having positive power. Consequently, since the light beam widens as it travels toward the concave mirror, there is a tendency for the diameter of the concave mirror to increase.

Japanese Patent Application Kokai No. Hei 4-234722 in particular discloses a round-trip combination optical system that is completely symmetrical. The generation of aberrations in this system is maximally controlled, making the correcting aberrations in successive refractive optical systems easier. However, since the system is symmetric, it is difficult to obtain sufficient working distance in the vicinity of the object plane, thereby requiring the use of a half-prism.

The optical system disclosed in U.S. Pat. No. 4,779,966 includes first and second imaging optical systems, and uses a mirror in the second imaging optical system, rearward of the intermediate image. However, to ensure adequate brightness, the light beam needs to widen as it approaches the concave mirror. Thus, it is difficult to make the concave mirror compact.

There is a possibility, with certain types of optical systems employing a plurality of mirrors, that the number of lenses in the refractive optical system can be reduced. However, these types of systems have a number of shortcomings. For example, a phase shift method has been conceived recently that shifts the phase of selected portions of the mask, thereby raising the resolving power while preserving the depth of focus. Further, the ratio σ between the NA of the illumination optical system and the NA of the imaging optical system has been made variable to enhance the imaging performance. Although an aperture stop can be installed in the illumination optical system to vary σ, an effective installation location for the stop cannot be found if the catadioptric optical system mentioned earlier is made the objective lens.

In catadioptric optical systems of the type employing a round-trip optical system of such an arrangement on the reduction side, a sufficient distance from the reflective mirror to the wafer (image plane) cannot be obtained due to issues related to the reduction magnification. Consequently, it is unavoidable that the brightness of the optical system is limited, since the number of lenses constituting the objective lens that can be inserted in the optical path is limited. For example, even if a high-NA optical system could be realized, a sufficient working distance WD between the wafer and the most wafer-wise surface of the projection lens could not be obtained due to the need to have a large number of optical members in a limited optical path length.

In addition, it is necessary in such conventional catadioptric optical systems to fold the optical path. However, the procedure of adjusting the optical path bending member is difficult, making a high-precision system difficult to realize.

Certain twice-imaging optical systems have many excellent advantages. However, to separate the light beam incident the concave mirror and the light beam reflected from the concave mirror, these optical systems must employ methods, such as using a light beam separating prism or an apertured mirror, or perform separation with a reflective mirror using an off-axis light beam.

With any of these methods, the optical axis of the optical system must be bent, at a right angle for example, using a reflective surface. Although this is quite easily accomplished compared with a conventional catadioptric optical system, this places a heavy burden on the adjustment mechanism of the optical system compared to an optical system based on just a conventional refractive system.

In other words, since most optical systems, including refractive optical systems, are constructed on a single linear optical axis, if the lens is mounted shifted or tilted with respect to this optical axis, the problem can be corrected by rotating the lens about this linear optical axis, and examining the reflected light and the like from the lens. Such an adjustment means cannot be adopted and the adjustment method becomes problematic if the optical axis is bent.

Furthermore, only two types of adjustments exist in an optical system comprising a single optical axis: tilting and shifting from the optical axis. However, with an optical system having a plurality of optical axes, six degrees of freedom arise in the three-dimensional space in a lens shifted from the single optical axis that forms the reference: the positional coordinates X, Y, Z, and the rotational angles α, β, γ about the X, Y, Z axes. Also, the number of components requiring such adjustments increases significantly. Consequently, the adjustment time increases, the cost increases, and there are numerous difficulties just in realizing the design performance in a precision optical system. The question of how to eliminate such troublesome adjustment has been a pending and critical issue in round-trip optical systems.

SUMMARY OF THE INVENTION

The present invention has the objective to provide a catadioptric optical system wherein the adjustment of the various parts is easy even though it has a plurality of optical axes.

To eliminate difficult adjustment of the various optical parts, the present invention is constructed so that the optical system that performs the imaging has only one optical axis.

Accordingly, a first aspect of the invention is a catadioptric optical system capable of forming an image of an object. The optical system comprises a first optical axis having a first end and a second end, with a concave mirror arranged at the first end, and a second surface orthogonal to the first optical axis at the second end. A reflective surface is arranged between the concave mirror and the second surface. A first imaging optical system comprising a first plurality of lenses is arranged between the reflective surface and the concave mirror. A second imaging optical system comprising a second plurality of lenses is arranged between the reflective surface and the second surface. The system further includes a second optical axis intersecting the first optical axis at the reflective surface and having a first surface disposed along and orthogonal to the secondary optical axis and removed from the reflective surface. The first surface is divided into first and second regions by a line of intersection between the first surface and a plane containing the first optical axis and the second optical axis. The object is arranged in one of the first and second regions of the first surface The image is formed in one of first and second regions of the second surface formed by dividing the second surface by a line of intersection between the second surface and a plane containing the first optical axis and the second optical axis. Also, the intermediate image of the object is formed in the vicinity of the reflective surface.

A second aspect of the invention is the catadioptric optical system as described above, except that the line of intersection dividing the first and second regions of the first and second surfaces is formed by a plane orthogonal to the first optical axis that includes the second optical axis.

A third aspect of the invention is the catadioptric optical system as described above, satisfying the following conditions:

$$0.8 < |D_1/H| < 3$$

$$20 < |L/H| < 30$$

wherein H is the maximum height of the object as measured from the second optical axis, $D_1$ is the distance along the secondary optical axis from the first surface to the reflective surface, and L is the distance along the principal optical axis from the concave mirror to the second surface.

A fourth aspect of the invention is the catadioptric optical system as described above, which satisfies the following condition:

$$|D_2/H| < 2.5$$

wherein $D_2$ is the distance along the first optical axis toward the concave mirror from the reflective surface to a lens surface closest to the reflective surface.

BRIEF EXPLANATION OF THE DRAWINGS

FIGS. 6(I)–6(IV) are aberration plots of spherical aberration, astigmatism, distortion and lateral aberrations, respectively, for Working Example 1;

FIG. 8(I)–8(IV) are aberration plots of spherical aberration, astigmatism, distortion and lateral aberrations, respectively, for Working Example 2;

FIG. 10(I)–10(IV) are aberration plots of spherical aberration, astigmatism, distortion and lateral aberrations, respectively, for Working Example 3.

FIGS. 15(I)–15(IV) are aberration plots of spherical aberration, astigmatism, distortion and lateral aberrations, respectively, for Working Example 4;

FIG. 17(I)–17(IV) are aberration plots of spherical aberration, astigmatism, distortion and lateral aberrations, respectively, for Working Example 5;

FIG. 19 (I)–19(IV) are aberration plots of spherical aberration, astigmatism, distortion and lateral aberrations, respectively, for Working Example 6.

DETAILED DESCRIPTION OF THE INVENTION

The present invention is a twice-imaging optical system having first and second imaging optical systems wherein an intermediate image of a second (object) surface is formed by the first imaging optical system. The intermediate image is then reimaged onto a first (image) surface by the second imaging optical system. A reflective surface is provided so that a light beam from the first imaging optical system is guided to the second imaging optical system. The first imaging optical system is formed so that it has a round-trip optical system comprising a concave mirror and a lens group through which both the light impinging on the concave mirror and the reflected light therefrom passes.

Based on this twice-imaging optical system, a optical system can be realized wherein an effective installation location for the stop can be obtained, and a sufficient distance between the wafer and the last (i.e., most imagewise) lens surface of the second imaging optical system, namely working distance WD, can be obtained while ensuring a sufficient brightness of the optical system. This allows the diameter of the concave mirror to be reduced and the ratio σ between the NA of the illumination optical system and the NA of the optical system to be made variable for imaging using so-called "phase shifting" techniques. In addition, the adjustment procedure of the optical path bending member is comparatively simple, and a high-precision optical system is realized.

Figure 1:
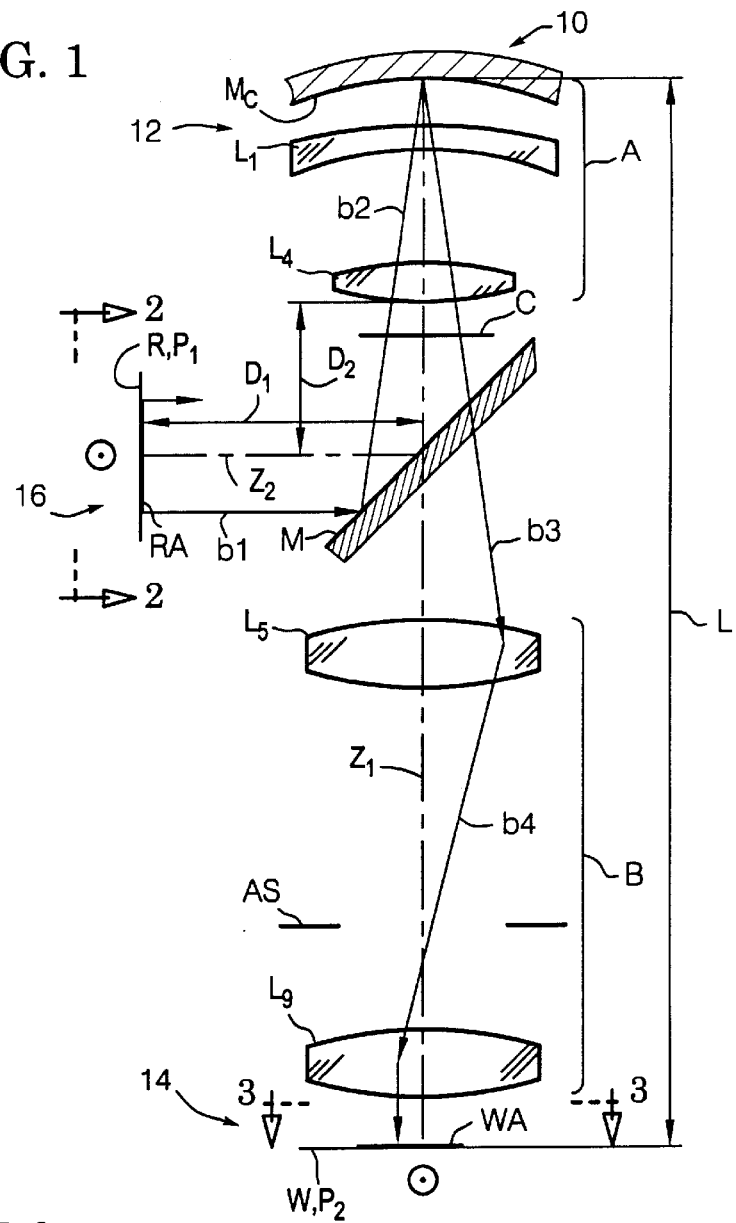
FIG. 1 is a schematic optical diagram of a first embodiment of the optical system of present invention.

With reference now to FIG. 1, optical system 10 comprises a first principal optical axis $Z_1$ with an upper end 12 and a lower end 14. A concave mirror $M_C$ is arranged along optical axis $Z_1$ at upper end 12 and a second surface $P_2$ orthogonal to optical axis $Z_1$ is provided at lower end 14. A plurality of lenses $L_1$–$L_9$, discussed further below, and a reflective surface M are arranged along principal optical axis $Z_1$ between concave mirror $M_C$ and second surface $P_2$. In FIG. 1, reflective surface M is shown as a plane mirror, but may be a reflective surface formed as a prism.

Optical system 10 includes a first imaging optical system A comprising lenses L1–L4 arranged in the optical path along axis $Z_1$ between reflective surface M and concave mirror $M_C$. Optical system 10 further includes a second imaging optical system B comprising lenses L5–L9 arranged in the optical path along axis $Z_1$ between reflective surface M and second surface $P_2$.

First imaging optical system A constitutes a double-pass (i.e., round-trip) optical system, meaning light passes twice in opposite directions through the elements therein. Reflective surface M is arranged so that it folds axis $Z_1$ to form a secondary optical axis $Z_2$ having an end 16. A first surface $P_1$ orthogonal to secondary optical axis $Z_2$ is provided along secondary optical axis $Z_2$ at end 16.

Figure 2:
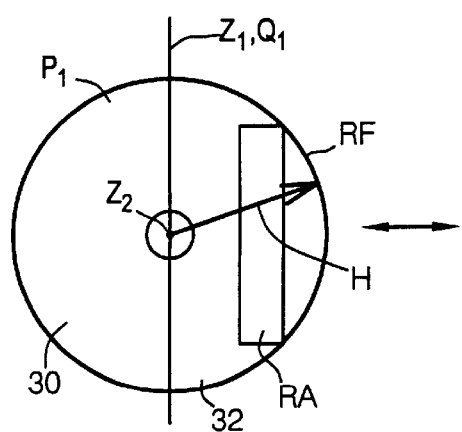
FIG. 2 is a diagram of the object field of the optical system of FIG. 1 taken along the cross-section 2—2.

With reference now to FIG. 2, $Q_1$ is the line of intersection of first surface $P_1$ and the plane that includes both axes $Z_1$ and $Z_2$ (i.e., the paper plane surface of FIG. 1), and RA is the illumination region of the object. The object may be, for example, a reticle R (see FIG. 1) having a pattern (not shown). Line $Q_1$ divides surface $P_1$ into first and second regions 30 and 32 with the first region being positioned beneath the plane of the paper surface of FIG. 1 and the second region being positioned above the plane of such paper surface. The object (reticle R) may be arranged in the second region 32 of first surface $P_1$.

Figure 3:
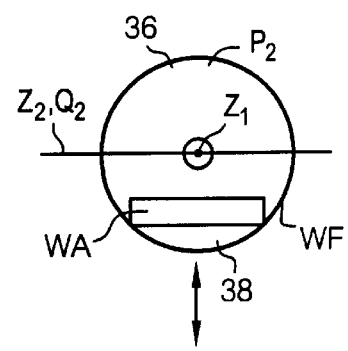
FIG. 3 is a diagram of the image field of the optical system of FIG. 1 taken along the cross-section 3—3.

With reference now to FIG. 3, $Q_2$ is the line of intersection between second surface $P_2$ and the plane that includes both optical axes $Z_1$ and $Z_2$. Line $Q_2$ divides surface $P_2$ into first and second regions 36 and 38, with the first region being positioned beneath the plane of the paper surface of FIG. 1 and the second region being positioned above the plane of such paper surface. The image of reticle R within illumination region RA is formed in the second region 38 of second surface $P_2$. A wafer W is arranged at second surface $P_2$ and an exposure region WA is formed thereon.

With reference again to FIG. 1, the travel direction of a light beam b1 proceeding from reticle R in illumination region RA is bent by reflective surface M, thereby forming a light beam b2 which enters first imaging optical system A and then travels toward concave mirror $M_C$. Light beam b2 is then reflected by concave mirror $M_C$, thereby forming light beam a b3 which travels in the reverse direction of light beam b2 along an outward path, and forms intermediate image C on the rear side of the paper surface in the vicinity of reflective surface M. In other words, the diameter of light beam b3 is minimized. Light beam b3 then travels past reflective surface M, passes through second imaging optical system B as a light beam b4 and reimages intermediate image C on exposure region WA of wafer W.

The portion of the pattern of reticle R that is inside illumination region RA is thus transferred to exposure region WA on wafer W. On the other hand, reticle R and wafer W are synchronously scanned and moved in a lateral direction orthogonal to both optical axes $Z_1$ and $Z_2$ (i.e., the direction orthogonal to paper surface of FIG. 1). This results in the entire region of the pattern of reticle R being transferred onto wafer W.

Furthermore, in the example shown in FIG. 1, although illumination region RA of reticle R is arranged in the second region 32 of first surface P1, illumination region RA can also be arranged in the first region 30. In this case, exposure region WA on wafer W is formed in first region 36 of second surface P2.

Reflective surface M is used in the present invention to separate light beam b2 incident concave mirror $M_C$ and light beam b3 reflected from concave mirror $M_C$. However, reflective surface M is arranged external to imaging optical systems A and B, and the optical axis of concave mirror $M_C$ and the plurality of lenses constituting imaging optical systems A and B is a single optical axis $Z_1$. Consequently, the entire optical system can be examined at its center (optical axis $Z_1$) and the tilt and shift of each internal lens can be detected.

Furthermore, reflective surface M may also be arranged after the adjustment of imaging optical systems A and B. In addition, there are only two types of adjustments for reflective surface M: position (shift) and angle (tilt) with respect to axis $Z_1$. Furthermore, the shift and tilt error of reflective surface M in this case is not directly related to imaging characteristics, and is simply either a shifting or tilting of the image. This is extremely advantageous for ensuring high-quality imaging performance.

In other words, if the bending of optical axes $Z_1$ and $Z_2$ is performed inside imaging optical systems A and B, the adjustment of reflective surface M becomes extremely difficult. However, by arranging reflective surface M outside of imaging optical systems A and B, the adjustment becomes extremely easy.

If reflective surface M is thus arranged outside of imaging optical systems A and B, several design conditions and characteristics are necessary from the standpoint of aberration correction and for the arrangement of the imaging optical systems. These design conditions are discussed below.

With continuing reference to FIG. 1, first, the portion of optical system 10 from the object (reticle R) to reflective surface M preferably contains no optical elements. Thus, the size of reflective surface M is basically determined by distance D, from reticle R to reflective surface M and by the objectwise NA. If distance $D_1$ is long, the size of reflective surface M inevitably increases. This is not preferred, since there is a risk that light beam b3 reflected by concave mirror $M_C$ and which proceeds to second imaging optical system B will interfere with reflective surface M. In addition, if reflective surface M is constructed as a prism, distance $D_1$ lengthens and reflective surface M gets larger. This is likewise not advantageous, since the prism itself increases in size. Accordingly, the shorter the distance $D_1$, the better.

However, if distance $D_1$ is made too short, there is a risk that reticle R will interfere with the optical path bending member comprising reflective surface M or some other optical system member. However, by arranging reflective surface M outside of imaging optical systems A and B, the adjustment of the entire optical system 10 becomes extremely easy. Accordingly, it is preferred that $D_1$ satisfy condition (1):

$$0.8 < |D_1/H| < 3 \qquad (1)$$

wherein H is the maximum height of illumination region RA as measured from axis $Z_2$, namely, the radius of reticle field RF. If $|D_1/H|$ exceeds the upper limit in condition (1), it is difficult to separate light beam b2 of the outward path that proceeds to concave mirror $M_C$ and light beam b3 of the return path reflected by concave mirror $M_C$. Conversely, if $|D_1/H|$ falls below the lower limit in condition (1), there is a risk that reticle R will interfere with the optical path bending member or some other optical system. If higher performance is desired, then the lower limit may preferably be set at 1 and the upper limit preferably set at 2.5.

In addition, light beam b1 widens as it moves away from reticle R, and further widens after being reflected by reflective surface M until it is incident the first lens surface of first imaging optical system A. Accordingly, since the effective diameter of first imaging optical system A becomes smaller, it is preferable that distance $D_2$ along axis $Z_1$ from reflective surface M satisfy design condition (2):

$$|D_2/H|<2.5 \qquad (2)$$

If $|D_2/H|$ exceeds the upper limit in condition (2), the effective diameter of first imaging optical system A increases excessively.

In addition, since there is no optical system in the optical path between the object (reticle R) and reflective surface M, the correction of distortion becomes difficult, and the distortion must be corrected almost entirely by second imaging optical system B.

In addition, it is preferable to make the construction of optical system 10 so that intermediate image C lies in the vicinity of reflective surface M. In other words, it is preferable to have a construction that fits approximately in the range from the upper end of reflective surface M (one end face) to the lower end (end face on opposite side thereof). This is advantageous from the standpoint of separating light beam b2 and b3. In particular, since light beam b1 widens as it moves away from reticle R, the farther is from reticle R, the larger surface M must be. For this reason, it is preferable to form the position of intermediate image C wherein the light beam diameter is minimized, in the vicinity of the end of reflective surface M closest to concave mirror $M_C$.

Since twice-imaging optical systems A and B are constructed on optical axis $Z_1$ in this manner, the overall length L of optical system 10 increases considerably. Consequently, a portion of first imaging optical system A must be shortened so that length L decreases as much as possible.

Figure 4:
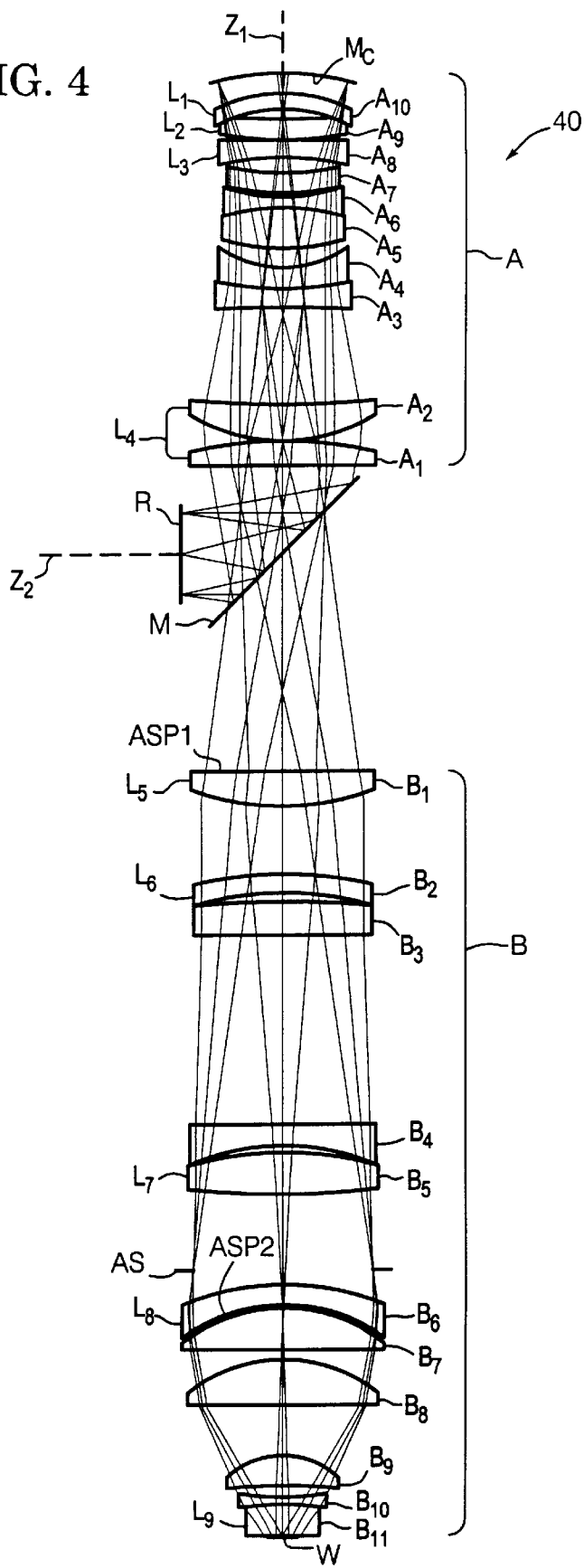
FIG. 4 is an optical path diagram of the optical system of Working Example 1 of the present invention.

Thus, with continuing reference to FIG. 1 and also to optical system 40 of FIG. 4, it is preferable that first imaging optical system A comprise, in order from concave mirror $M_C$, at least negative meniscus lens $L_1$ and positive lens $L_4$. Furthermore, it is preferable that first imaging optical system have, in order from the concave mirror $M_C$ side, at least negative meniscus lens $L_1$, a positive lens $L_2$, a negative lens $L_3$ and positive lens $L_4$. By adopting such arrangement, the length of first imaging optical system A can be decreased.

If imaging optical system A is shortened too much, aberrations cannot be completely corrected. Therefore, it is preferable the optical system of the present invention satisfy design condition (3):

$$20<|L/H|<30 \qquad (3)$$

If $|L/H|$ exceeds the upper limit in condition (3), the size of the entire optical system becomes too large. Conversely, if $|L/H|$ falls below the lower limit in conditional expression (3), optical performance deteriorates.

With regard to second imaging optical system B in optical system 10 of FIG. 1, it is preferable to arrange a positive lens $L_5$ first in order from intermediate image C toward wafer W. In so doing, divergence of light beam b4 can be prevented, and an increase in the diameter of optical system 10 can also be prevented.

With reference now also to FIG. 4 and optical system 40 (to be discussed in more detail below), it is also preferable to arrange a negative lens $L_6$ wafer-wise and adjacent lens $L_5$ for correcting distortion. In addition, an aperture stop AS is arranged in second imaging optical system B. It is also preferable to arrange a positive lens $L_7$ and a meniscus lens $L_8$ in the vicinity of aperture stop AS to correct spherical aberration. It is also preferable to arrange a positive lens $L_9$, whose convex surface faces the reflective surface M side, in the vicinity of the imaging plane (i.e., first surface $P_1$) to achieve a large NA.

It is also preferable to employ an aspherical surface (e.g., ASP2) to correct spherical aberration in the vicinity of aperture stop AS, and also to employ an aspherical surface in the positive lens in the vicinity of intermediate image C to correct distortion.

By adopting the above construction, nearly all aberrations can be corrected simultaneously. As a result, the number of lenses is ultimately significantly reduced, an extremely compact optical system can be obtained, and the optical system can ultimately be constructed with a single optical axis $Z_1$ while using a minimum of aspherical elements.

Furthermore, in the abovementioned mode for carrying out the present invention, illumination region RA of reticle R is arranged on first surface $P_1$, and the image of the object is formed on second surface $P_2$. However, this arrangement can also be reversed so that the object is arranged on second surface $P_2$ and the image is formed on first surface $P_1$.

In addition, although there are some difficulties with regard to modifying the lens and adjusting the optical axis, the entire optical system 10 (FIG. 1) can be made compact by arranging a very small number of lenses, for example a positive lens, between first surface $P_1$ and reflective surface M, and by making first imaging optical system A include this small number of lenses.

With reference again to FIGS. 1 and 2, illumination region RA of reticle R is arranged in region 32 that is on the front side of the paper surface of first surface $P_1$. Also, with reference again to FIG. 3, exposure region WA of wafer W is arranged in region 38. As a result, the scanning direction of reticle R and wafer W is the lateral direction orthogonal to both optical axes $Z_1$ and $Z_2$ (i.e., the direction orthogonal to the paper surface of FIG. 1).

In place of this construction, illumination region RA of reticle R can also be arranged in region 30 and exposure region WA of wafer W can be arranged in region 38. With this construction, the scanning direction of reticle R is the longitudinal direction parallel to principal optical axis $Z_1$, and the scanning direction of wafer W is the direction parallel to secondary optical axis $Z_2$.

With this longitudinal scan-type construction, reflective surface M is long in the left-right direction, and short in the depth direction when viewed from the side of reticle R arranged on first surface P1 (e.g., the view of FIG. 1). On the other hand, since the diameter of light beam b1 increases in the depth direction, reflective surface M can be made smaller by reflecting the light beam on the lower end of reflective surface M, which is a shorter distance from reticle R.

However, with the lateral scan-type construction according to the present invention, reflective surface M is short in the left-right direction and long in the depth direction when viewed from the side of reticle R. Further, the diameter of light beam b1 increases in the depth direction. Accordingly, there is a disadvantage in that the size of reflective surface M ultimately increases.

According to the longitudinal scan-type construction, the scanning direction of reticle R arranged on the first surface is the direction parallel to the optical axis $Z_1$, and the scanning direction of wafer W is the direction parallel to optical axis $Z_2$. Further, principal optical axis $Z_1$ is generally arranged in the vertical direction, the scanning direction of reticle R is the vertical direction.

Accurate scanning in the horizontal direction can be realized with comparative ease. However, if scanning is in the vertical direction, gravity continuously acts in the scanning direction and a force opposite to gravity must be added to compensate. Accordingly, accurate scanning generally cannot be easily realized.

To solve this problem, it is preferable to make the scanning direction of reticle R and the scanning direction of wafer W both horizontal. However, in this case, optical axis $Z_1$ is in the horizontal direction and, accordingly, all lenses comprising the optical system are arranged vertically. Thus, there is a risk that the lenses themselves will deform as well as a risk the lenses will slip due to gravity when handling during adjustment.

In contrast, in the present invention, both the scanning direction of reticle R and the scanning direction of wafer W are orthogonal to both optical axes $Z_1$ and $Z_2$. Therefore, principal optical axis $Z_1$ can be aligned with the vertical direction. Also, the scanning direction of reticle R and the scanning direction of wafer W can be made the horizontal direction. This allows for scanning to be performed without the need to compensate for gravity.

WORKING EXAMPLES

The following describes Working Examples 1–6 of the present invention. Each of the Working Examples apply the optical system according to the present invention to a scanning-type exposure apparatus.

Tables 1–6 below list the various specifications of Working Example 1 to Working Example 6, respectively. In the "Principal Specifications" section in Tables 1A–6A, $\lambda$ is the working wavelength, $\beta$ is the projection magnification, NA is the imagewise numerical aperture, and $\emptyset_{max}$ is the maximum effective diameter of the lens. In the "Specifications of Optical Members" section of these tables, S in the first column is the number of each optical surface from the reticle R side, r in the second column is the radius of curvature of each optical surface, d in the third column is the axial spacing from each optical surface to the next optical surface. In Tables 1A–3A, the fourth column G is the glass type. Also included as the last column in Tables 1A–6A is a column E representing the symbol for each optical surface or optical element.

The refractive index n of the fused quartz ($SiO_2$) and fluorite ($CaF_2$) at the working wavelength ($\lambda=193$ nm) is as follows.

$SiO_2$: n=1.56033

$CaF_2$: n=1.50146

In addition, optical surfaces with an asterisk (*) in first column S indicates an aspherical surface, and the value of r in the second column for aspherical surfaces indicates the vertex radius of curvature.

The shape of an aspherical surface is described by:

$$z(y)=(y^2/r)/\{1+(1-(1+\kappa)y^2/r^2)^{1/2}\}+Ay^4+By^6+Cy^8+Dy^{10}$$

wherein, y=height from the optical axis, z=distance in the optical axis direction from the tangential plane to the aspherical surface, r=vertex radius of curvature, $\kappa$=conical coefficient, and A, B, C, D=aspherical coefficients.

Further, the aspherical coefficients A, B, C, D are shown in Tables 1B–6B Aspherical Surface Data. The conical coefficient $\kappa$ is 0.0 for each aspherical surface.

Exposure region WA of the optical system in each Working Example is a rectangular aperture measuring 25×6.6 mm. However, by scanning wafer W relative to exposure region WA, the entire exposure surface area on wafer W, for example a region measuring 25×33 mm, can be exposed.

In addition, in Working Examples 1–3, the effective diameter of the working lenses is approximately the same as or less than refractive spherical optical systems normally used for this specification. For Working Examples 3–6, the effective diameter of the working lenses is approximately ¾ that of refractive spherical optical systems normally used for this specification. Also, for Working Examples 1–6, the number of working lenses is also small at approximately half that of refractive spherical optical systems.

In each aberration plot (FIGS. 6, 8, 10, 15, 17 and 19), NA indicates the imagewise numerical aperture, and Y indicates the image height. In addition, in each astigmatism plot (FIGS. 6(II), 8(II), 10(II), 15(II), 17(II) and 18(II)), dotted line M indicates the meridional image plane, and solid line S indicates the sagittal image plane.

WORKING EXAMPLES 1–3

Figure 5:
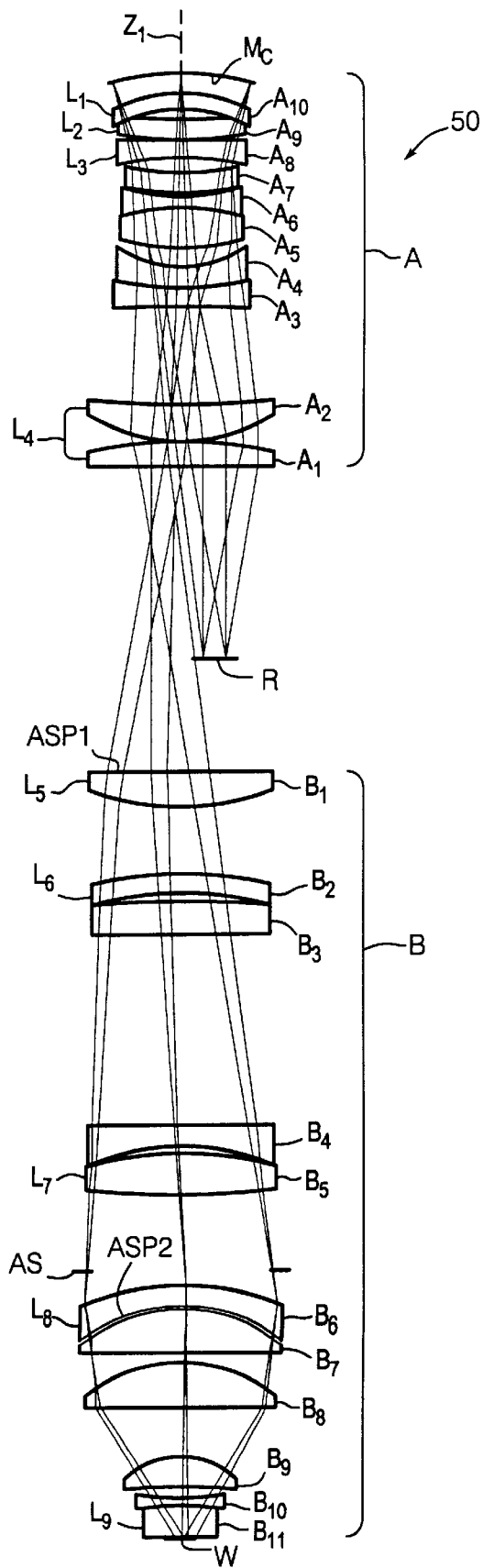
FIG. 5 is an optical path diagram of the optical system of FIG. 4, wherein the reflective surface of the optical system of Working Example 1 is eliminated.

Working Examples 1–3 are representative of a first embodiment of the optical system of the present invention. Optical systems 40 and 50 (FIGS. 4 and 5, respectively) represent variations of Working Example 1. In these optical systems, light beam separating mirror M is arranged after reticle R.

With reference now to FIG. 4 and optical system 40 of Working Example 1, first imaging optical system A is a round-trip optical system comprising, in order along optical axis $Z_1$ from the mirror M side, two positive lenses $A_1$ and $A_2$, a negative lens $A_3$, a negative meniscus lens $A_4$, a positive lens $A_5$, a negative lens $A_6$, a positive lens $A_7$, a negative lens $A_8$, a positive lens $A_9$, a negative meniscus lens $A_{10}$, whose concave surface faces the mirror M side, and concave mirror $M_C$.

Second imaging optical system B comprises, in order along optical axis $Z_1$ from the mirror M side toward wafer W, a positive lens $B_1$, a negative meniscus lens $B_2$, a positive lens $B_3$, a negative lens $B_4$, a positive lens $B_5$, aperture stop AS, a meniscus lens $B_6$, three positive lenses $B_7$, $B_8$ and $B_9$, a negative lens $B_{10}$ and a positive lens $B_{11}$ whose convex surface faces the light beam separating mirror M side. The glass material of all lenses is fused quartz.

TABLE 1A

DESIGN SPECIFICATION

Principal Specifications: $\lambda = 193$ nm (ArF Excimer Laser)
$\beta = \frac{1}{4}$  NA = 0.75
H = 69.76 mm   $D_1 = 136.1$ mm   $D_2 = 121.6$ mm
L = 1981 mm   $\varnothing_{max} = 275$ mm
Exposure Field: 25 × 6.6 mm
$|D_1/H| = 1.95$   $|D_2/H| = 1.74$   $|L/H| = 28.4$

| S | r | d | G | | E |
|---|---|---|---|---|---|
| 0 | ∞ | 136.100000 | | R | |
| 1 | ∞ | −121.622282 | | M | |
| 2 | −1967.58802 | −36.300000 | $SiO_2$ | $A_1$ | $L_4$ |
| 3 | 461.23833 | −0.106920 | | | |
| 4 | −264.03622 | −44.000000 | $SiO_2$ | $A_2$ | $L_4$ |
| 5 | −1512.13989 | −131.494209 | | | |
| 6 | 1221.82968 | −29.700000 | $SiO_2$ | $A_3$ | |
| 7 | −25338.03804 | −0.299345 | | | |
| 8 | −664.00557 | −27.500000 | $SiO_2$ | $A_4$ | |
| 9 | −148.84974 | −24.814835 | | | |
| 10 | −251.86051 | −49.500000 | $SiO_2$ | $A_5$ | |
| 11 | 360.39841 | −0.100000 | | | |
| 12 | 482.78552 | −18.700000 | $SiO_2$ | $A_6$ | |
| 13 | −281.19596 | −5.034093 | | | |
| 14 | −563.37964 | −27.500000 | $SiO_2$ | $A_7$ | |
| 15 | −2045.99337 | −20.460000 | | | |
| 16 | 235.10356 | −18.700000 | $SiO_2$ | $A_8$ | |
| 17 | −4300.32289 | −1.594260 | | | |
| 18 | −426.84111 | −27.500000 | $SiO_2$ | $A_9$ | |
| 19 | 4351.96037 | −13.911919 | | | |
| 20 | 209.48701 | −19.800000 | $SiO_2$ | $A_{10}$ | $L_1$ |
| 21 | 296.68194 | −31.698975 | | | |
| 22 | 328.68841 | 31.698975 | | $M_C$ | |
| 23 | 296.68194 | 19.800000 | $SiO_2$ | $A_{10}$ | |
| 24 | 209.48701 | 13.911919 | | | |
| 25 | 4351.96037 | 27.500000 | $SiO_2$ | $A_9$ | |
| 26 | −426.84111 | 1.594260 | | | |
| 27 | −4300.32289 | 18.700000 | $SiO_2$ | $A_8$ | |
| 28 | 235.10356 | 20.460000 | | | |
| 29 | −2045.99337 | 27.500000 | $SiO_2$ | $A_7$ | |
| 30 | −563.37964 | 5.034093 | | | |
| 31 | −281.19596 | 18.700000 | $SiO_2$ | $A_6$ | |
| 32 | 482.78552 | 0.100000 | | | |
| 33 | 360.39841 | 49.500000 | $SiO_2$ | $A_5$ | |
| 34 | −251.86051 | 24.814835 | | | |
| 35 | −148.84974 | 27.500000 | $SiO_2$ | $A_4$ | |
| 36 | −664.00557 | 0.299345 | | | |
| 37 | −25338.03804 | 29.700000 | $SiO_2$ | $A_3$ | |
| 38 | 1221.82968 | 131.494209 | | | |
| 39 | −1512.13989 | 44.000000 | $SiO_2$ | $A_2$ | |
| 40 | −264.03622 | 0.106920 | | | |
| 41 | 461.23833 | 36.300000 | $SiO_2$ | $A_1$ | |
| 42 | −1967.58802 | 414.335315 | | | |
| *43 | 6876.44925 | 44.000000 | $SiO_2$ | $B_1$ | $L_5$ |
| 44 | −488.24425 | 98.273364 | | | |
| 45 | 949.54747 | 23.100000 | $SiO_2$ | $B_2$ | $L_6$ |
| 46 | 380.00000 | 10.438319 | | | |
| 47 | 824.60830 | 49.500000 | $SiO_2$ | $B_3$ | |
| 48 | −11352.29016 | 254.550884 | | | |
| 49 | −51712.00506 | 26.400000 | $SiO_2$ | $B_4$ | |
| 50 | 310.24257 | 6.440918 | | | |
| 51 | 378.70003 | 61.600000 | $SiO_2$ | $B_5$ | $L_7$ |
| 52 | −835.09235 | 86.082771 | | | |
| 53 | — | 37.011572 | | AS | |
| 54 | 312.99786 | 27.500000 | $SiO_2$ | $B_6$ | $L_8$ |
| *55 | 317.35784 | 4.761030 | | | |
| 56 | 265.14846 | 49.500000 | $SiO_2$ | $B_7$ | |
| 57 | −2270.69764 | 15.548079 | | | |
| 58 | 231.99665 | 60.500000 | $SiO_2$ | $B_8$ | |
| 59 | −14822.69804 | 67.603735 | | | |
| 60 | 143.66448 | 36.300000 | $SiO_2$ | $B_9$ | |
| 61 | 827.06470 | 10.206244 | | | |
| 62 | −5784.09653 | 13.200000 | $SiO_2$ | $B_{10}$ | |
| 63 | 404.40593 | 0.100000 | | | |
| 64 | 185.03629 | 49.500000 | $SiO_2$ | $B_{11}$ | $L_9$ |
| 65 | 2867.73663 | 6.000000 | | | |
| 66 | ∞ | | | W | |

TABLE 1B

ASPHERICAL SURFACE DATA

| S43 | A = | $-0.446592 \times 10^{-8}$ | B = | $-0.453957 \times 10^{-14}$ |
|---|---|---|---|---|
| | C = | $-0.205385 \times 10^{-18}$ | D = | $-0.485866 \times 10^{-23}$ |
| S55 | A = | $0.130299 \times 10^{-7}$ | B = | $0.108307 \times 10^{-12}$ |
| | C = | $0.107069 \times 10^{-17}$ | D = | $0.132127 \times 10^{-22}$ |

Figure 7:
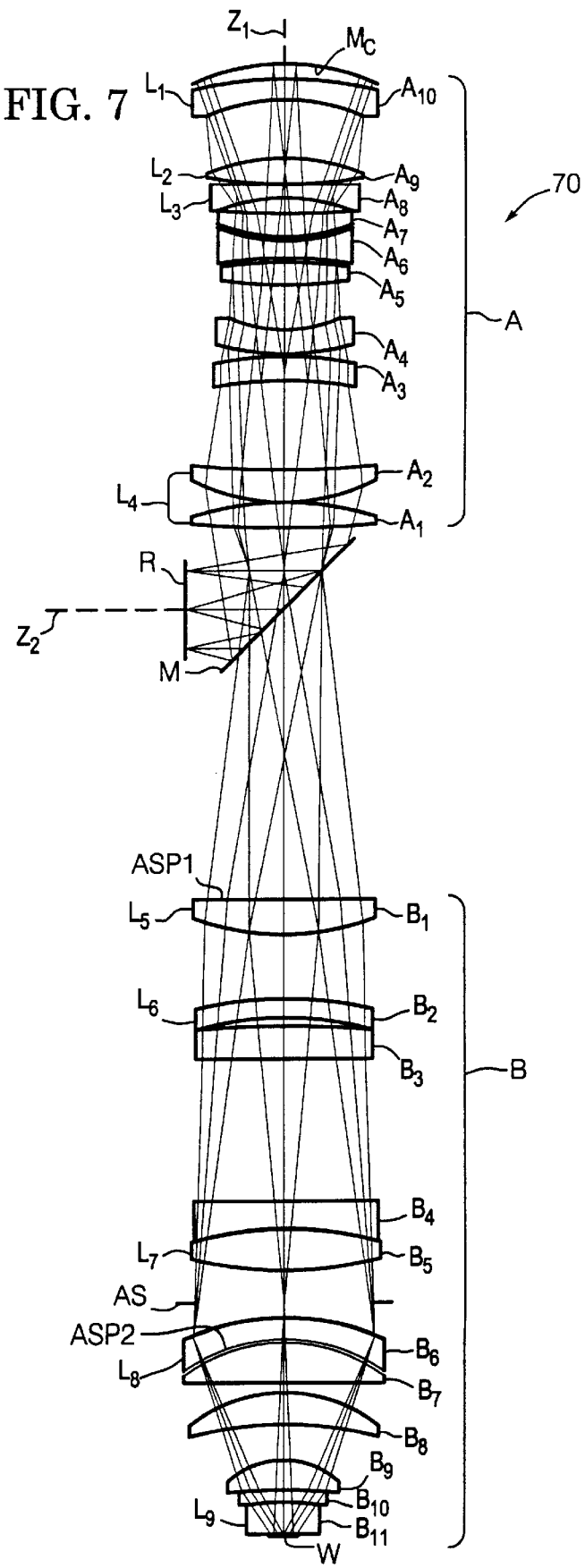
FIG. 7 is an optical path diagram of the optical system of Working Example 2 of the present invention.

With reference now to FIG. 7 and optical system 70 of Working Example 2, light beam separating mirror M is arranged after reticle R.

First imaging optical system A of optical system 70 is a round-trip optical system comprising, in order along optical axis $Z_1$ from the mirror M side, two positive lenses $A_1$ and $A_2$, a meniscus lens $A_3$, a negative meniscus lens $A_4$, a positive lens $A_5$, a negative lens $A_6$, a positive lens $A_7$, a negative lens $A_8$, a positive lens $A_9$, a negative meniscus lens $A_{10}$ whose concave surface faces the mirror M side, and concave mirror $M_C$.

Second imaging optical system B comprises, in order from the mirror M side, positive lens $B_1$, a negative lens $B_2$, a positive lens $B_3$, a negative lens $B_4$, a positive lens $B_5$, aperture stop AS, a meniscus lens $B_6$, three positive lenses $B_7$, $B_8$, and $B_9$, a negative lens $B_{10}$ and a positive lens $B_{11}$ whose convex surface faces the mirror M side. The glass material of lenses $A_9$ and $B_4$ is fluorite, and the glass material of the other lenses is fused quartz.

TABLE 2A

DESIGN SPECIFICATION

Principal Specifications: $\lambda = 193$ nm (ArF Excimer Laser)
$\beta = \frac{1}{4}$   NA = 0.75
H = 68.2 mm   $D_1 = 145.1$ mm   $D_2 = 112.6$ mm
L = 1944 mm   $\varnothing_{max} = 259$ mm
Exposure Field: 25 × 6.6 mm
$|D_1/H| = 2.13$   $|D_2/H| = 1.65$   $|L/H| = 28.5$

| S | r | d | G | | E |
|---|---|---|---|---|---|
| 0 | ∞ | 145.100000 | | R | |
| 1 | ∞ | −112.591130 | | M | |
| 2 | −1967.58802 | −36.300000 | $SiO_2$ | $A_1$ | $L_4$ |
| 3 | 461.23833 | −0.106920 | | | |
| 4 | −321.33912 | −44.000000 | $SiO_2$ | $A_2$ | $L_4$ |
| 5 | −2100.88923 | −122.583142 | | | |
| 6 | 501.10504 | −29.700000 | $SiO_2$ | $A_3$ | |
| 7 | 541.11926 | −0.324595 | | | |
| 8 | −473.18044 | −27.500000 | $SiO_2$ | $A_4$ | |
| 9 | −196.17212 | −62.580381 | | | |
| 10 | −3779.07966 | −30.000000 | $SiO_2$ | $A_5$ | |
| 11 | 387.11621 | −4.367656 | | | |
| 12 | 412.88313 | −18.700000 | $SiO_2$ | $A_6$ | |
| 13 | −192.61791 | −1.582265 | | | |
| 14 | −201.03547 | −35.000000 | $SiO_2$ | $A_7$ | |
| 15 | −1414.97510 | −20.460000 | | | |
| 16 | 204.63720 | −18.700000 | $SiO_2$ | $A_8$ | |
| 17 | 100789.97971 | −0.100000 | | | |
| 18 | −695.29793 | −40.000000 | $CaF_2$ | $A_9$ | |
| 19 | 292.92171 | −95.224100 | | | |
| 20 | 209.38224 | −19.800000 | $SiO_2$ | $A_{10}$ | $L_1$ |
| 21 | 533.83495 | −15.723944 | | | |
| 22 | 333.25466 | 15.723944 | | $M_C$ | |
| 23 | 533.83495 | 19.800000 | $SiO_2$ | $A_{10}$ | |
| 24 | 209.38224 | 95.224100 | | | |
| 25 | 292.92171 | 40.000000 | $CaF_2$ | $A_9$ | |
| 26 | −695.29793 | 0.100000 | | | |
| 27 | 100789.97971 | 18.700000 | $SiO_2$ | $A_8$ | |
| 28 | 204.63720 | 20.460000 | | | |
| 29 | −1414.97510 | 35.000000 | $SiO_2$ | $A_7$ | |
| 30 | −201.03547 | 1.582265 | | | |
| 31 | −192.61791 | 18.700000 | $SiO_2$ | $A_6$ | |
| 32 | 412.88313 | 4.367656 | | | |

TABLE 2A-continued

DESIGN SPECIFICATION

| | | | | | |
|---|---|---|---|---|---|
| 33 | 387.11621 | 30.000000 | SiO$_2$ | A$_5$ | |
| 34 | −3779.07966 | 62.580381 | | | |
| 35 | −196.17212 | 27.500000 | SiO$_2$ | A$_4$ | |
| 36 | −473.18044 | 0.324595 | | | |
| 37 | 541.11926 | 29.700000 | SiO$_2$ | A$_3$ | |
| 38 | 501.10504 | 122.583142 | | | |
| 39 | −2100.88923 | 44.000000 | SiO$_2$ | A$_2$ | |
| 40 | −321.33912 | 0.106920 | | | |
| 41 | 461.23833 | 36.300000 | SiO$_2$ | A$_1$ | |
| 42 | −1967.58802 | 442.591130 | | | |
| *43 | 1891.18025 | 40.000000 | SiO$_2$ | B$_1$ | L$_5$ |
| 44 | −646.79536 | 91.872138 | | | |
| 45 | 723.36962 | 21.000000 | SiO$_2$ | B$_2$ | L$_6$ |
| 46 | 309.77480 | 11.273401 | | | |
| 47 | 614.63478 | 45.000000 | SiO$_2$ | B$_3$ | |
| 48 | −4366.41782 | 199.362566 | | | |
| 49 | −1798.05238 | 24.000000 | CaF$_2$ | B$_4$ | |
| 50 | 275.00000 | 2.000000 | | | |
| 51 | 290.42916 | 60.000000 | SiO$_2$ | B$_5$ | L$_7$ |
| 52 | −483.42767 | 38.284844 | | | |
| 53 | — | 30.904398 | | AS | |
| 54 | 338.19712 | 25.100000 | SiO$_2$ | B$_6$ | L$_8$ |
| *55 | 276.01919 | 1.423682 | | | |
| 56 | 240.27695 | 55.000000 | SiO$_2$ | B$_7$ | |
| 57 | −626.12954 | 4.097833 | | | |
| 58 | 181.45355 | 52.000000 | SiO$_2$ | B$_8$ | |
| 59 | 322.99376 | 50.392410 | | | |
| 60 | 150.71383 | 33.000000 | SiO$_2$ | B$_9$ | |
| 61 | −1959.54185 | 1.388394 | | | |
| 62 | −981.40546 | 12.000000 | SiO$_2$ | B$_{10}$ | |
| 63 | 956.38699 | 0.378132 | | | |
| 64 | 211.73541 | 74.737842 | SiO$_2$ | B$_{11}$ | L$_9$ |
| 65 | 2253.26069 | 6.000000 | | | |
| 66 | ∞ | | | W | |

TABLE 2B

ASPHERICAL SURFACE DATA

| | | | | |
|---|---|---|---|---|
| S43 | A = | −0.540229 × 10$^{-8}$ | B = | 0.302102 × 10$^{-14}$ |
| | C = | 0.214457 × 10$^{-20}$ | D = | 0.311899 × 10$^{-23}$ |
| S55 | A = | 0.119727 × 10$^{-7}$ | B = | 0.127533 × 10$^{-12}$ |
| | C = | 0.785499 × 10$^{-18}$ | D = | −0.270797 × 10$^{-23}$ |

Figure 9:
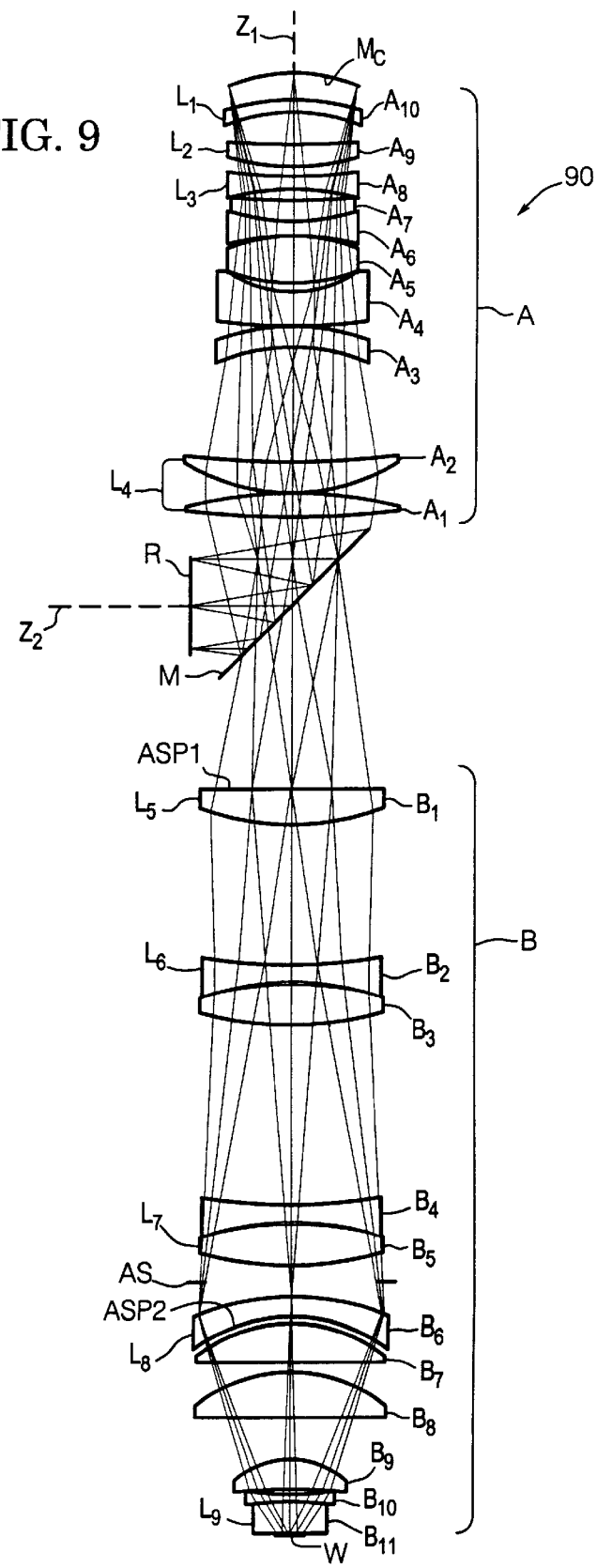
FIG. 9 is an optical path diagram of the optical system of Working Example 3 of the present invention.

With reference now to FIG. 9 and optical system 90 of Working Example 3, light beam separating mirror M is arranged after reticle R.

First imaging optical system A of projector optical system 90 is a round-trip optical system comprising, in order along optical axis Z$_1$ from the mirror M side, two positive lenses A$_1$ and A$_2$, a meniscus lens A$_3$, a negative meniscus lens A$_4$, a positive lens A$_5$, a negative lens A$_6$, a positive lens A$_7$, a negative lens A$_8$, a positive lens A$_9$, a negative meniscus lens A$_{10}$ whose concave surface faces the mirror M side, and concave mirror M$_C$.

Second imaging optical system B comprises, in order from the mirror M side, a positive lens B$_1$, a negative lens B$_2$, a positive lens B$_3$, a negative lens B$_4$, a positive lens B$_5$, aperture stop AS, a meniscus lens B$_6$, three positive lenses B$_7$, B$_8$ and B$_9$, a negative lens B$_{10}$, and a positive lens B$_{11}$ whose convex surface faces the light beam separating mirror M side. The glass material of all the lenses is fused quartz.

TABLE 3A

DESIGN SPECIFICATION

Principal Specifications: λ = 193 nm (ArF Excimer Laser)
β = ¼   NA = 0.77
H = 66.8 mm   D$_1$ = 125.1 mm   D$_2$ = 110.0 mm
L = 1734 mm   ⌀$_{max}$ = 251 mm
Exposure Field: 25 × 6.6 mm
|D$_1$/H| = 1.87   |D$_2$/H| = 1.65   |L/H| = 26.0

| S | r | d | G | | E |
|---|---|---|---|---|---|
| 0 | ∞ | 125.100000 | | R | |
| 1 | ∞ | −110.000000 | | M | |
| 2 | −1788.71693 | −33.000000 | SiO$_2$ | A$_1$ | L$_4$ |
| 3 | 419.30758 | −0.097200 | | | |
| 4 | −250.51272 | −40.000000 | SiO$_2$ | A$_2$ | L$_4$ |
| 5 | −2095.38285 | −132.582944 | | | |
| 6 | 280.08897 | −27.000000 | SiO$_2$ | A$_3$ | |
| 7 | 286.06919 | −0.100000 | | | |
| 8 | −2344.69801 | −25.000000 | SiO$_2$ | A$_4$ | |
| 9 | −139.16277 | −10.583805 | | | |
| 10 | −230.81019 | −45.000000 | SiO$_2$ | A$_5$ | |
| 11 | 289.72574 | −0.100000 | | | |
| 12 | 396.50913 | −17.000000 | SiO$_2$ | A$_6$ | |
| 13 | −202.10491 | −2.545072 | | | |
| 14 | −245.66623 | −25.000000 | SiO$_2$ | A$_7$ | |
| 15 | −850.43638 | −18.600000 | | | |
| 16 | 191.90096 | −17.000000 | SiO$_2$ | A$_8$ | |
| 17 | 1441.97113 | −8.542734 | | | |
| 18 | −319.52135 | −25.000000 | SiO$_2$ | A$_9$ | |
| 19 | −1032.91485 | −35.037850 | | | |
| 20 | 229.55442 | −18.000000 | SiO$_2$ | A$_{10}$ | L$_1$ |
| 21 | 391.22655 | −20.529633 | | | |
| 22 | 293.81625 | 20.529633 | | M$_C$ | |
| 23 | 391.22655 | 18.000000 | SiO$_2$ | A$_{10}$ | |
| 24 | 229.55442 | 35.037850 | | | |
| 25 | −1032.91485 | 25.000000 | SiO$_2$ | A$_9$ | |
| 26 | −319.52135 | 8.542734 | | | |
| 27 | 1441.97113 | 17.000000 | SiO$_2$ | A$_8$ | |
| 28 | 191.90096 | 18.600000 | | | |
| 29 | −850.43638 | 25.000000 | SiO$_2$ | A$_7$ | |
| 30 | −245.66623 | 2.545072 | | | |
| 31 | −202.10491 | 17.000000 | SiO$_2$ | A$_6$ | |
| 32 | 396.50913 | 0.100000 | | | |
| 33 | 289.72574 | 45.000000 | SiO$_2$ | A$_5$ | |
| 34 | −230.81019 | 10.583805 | | | |
| 35 | −139.16277 | 25.000000 | SiO$_2$ | A$_4$ | |
| 36 | −2344.69801 | 0.100000 | | | |
| 37 | 286.06919 | 27.000000 | SiO$_2$ | A$_3$ | |
| 38 | 280.08897 | 132.582944 | | | |
| 39 | −2095.38285 | 40.000000 | SiO$_2$ | A$_2$ | |
| 40 | −250.51272 | 0.097200 | | | |
| 41 | 419.30758 | 33.000000 | SiO$_2$ | A$_1$ | |
| 42 | −1788.71639 | 347.180778 | | | |
| *43 | 1555.13047 | 40.000000 | SiO$_2$ | B$_1$ | L$_5$ |
| 44 | −360.06064 | 118.910547 | | | |
| 45 | −397.98234 | 21.000000 | SiO$_2$ | B$_2$ | L$_6$ |
| 46 | 301.16710 | 6.265312 | | | |
| 47 | 456.49362 | 45.000000 | SiO$_2$ | B$_3$ | |
| 48 | −457.50529 | 216.938305 | | | |
| 49 | −912.13011 | 24.000000 | SiO$_2$ | B$_4$ | |
| 50 | 285.72541 | 2.779460 | | | |
| 51 | 324.54787 | 56.000000 | SiO$_2$ | B$_5$ | L$_7$ |
| 52 | −517.93077 | 33.030511 | | | |
| 53 | — | 10.000000 | | AS | |
| 54 | 232.91811 | 25.000000 | SiO$_2$ | B$_6$ | L$_8$ |
| *55 | 247.47594 | 13.513156 | | | |
| 56 | 272.86464 | 45.000000 | SiO$_2$ | B$_7$ | |
| 57 | −1299.32741 | 13.009095 | | | |
| 58 | 181.50497 | 55.000000 | SiO$_2$ | B$_8$ | |
| 59 | 3103.88212 | 57.514255 | | | |
| 60 | 122.59580 | 33.000000 | SiO$_2$ | B$_9$ | |
| 61 | 842.87047 | 6.906830 | | | |
| 62 | 2024.08428 | 12.000000 | SiO$_2$ | B$_{10}$ | |
| 63 | 171.55062 | 0.100000 | | | |
| 64 | 121.12960 | 45.000000 | SiO$_2$ | B$_{11}$ | L$_9$ |
| 65 | 1872.51465 | 6.000000 | | | |
| 66 | ∞ | | | W | |

TABLE 3B

ASPHERICAL SURFACE DATA

| S43 | A = | $-0.564743 \times 10^{-8}$ | B = | $0.301731 \times 10^{-14}$ |
|---|---|---|---|---|
|  | C = | $-0.487516 \times 10^{-18}$ | D = | $-0.257273 \times 10^{-22}$ |
| S55 | A = | $0.191005 \times 10^{-7}$ | B = | $0.183987 \times 10^{-12}$ |
|  | C = | $0.211392 \times 10^{-17}$ | D = | $0.297490 \times 10^{-22}$ |

It can be clearly seen from the aberration plots in FIGS. 6, 8 and 10 corresponding respectively to Working Examples 1–3, in the unit wavelength of 193 nm in Working Example 1 and Working Example 3, and in the wavelength range of 193 nm ±5 pm in Working Example 2, excellent imaging performance is obtained and aberrations are corrected to nearly an aberration-free state for each Working Example.

WORKING EXAMPLES 3–6

Figure 11:
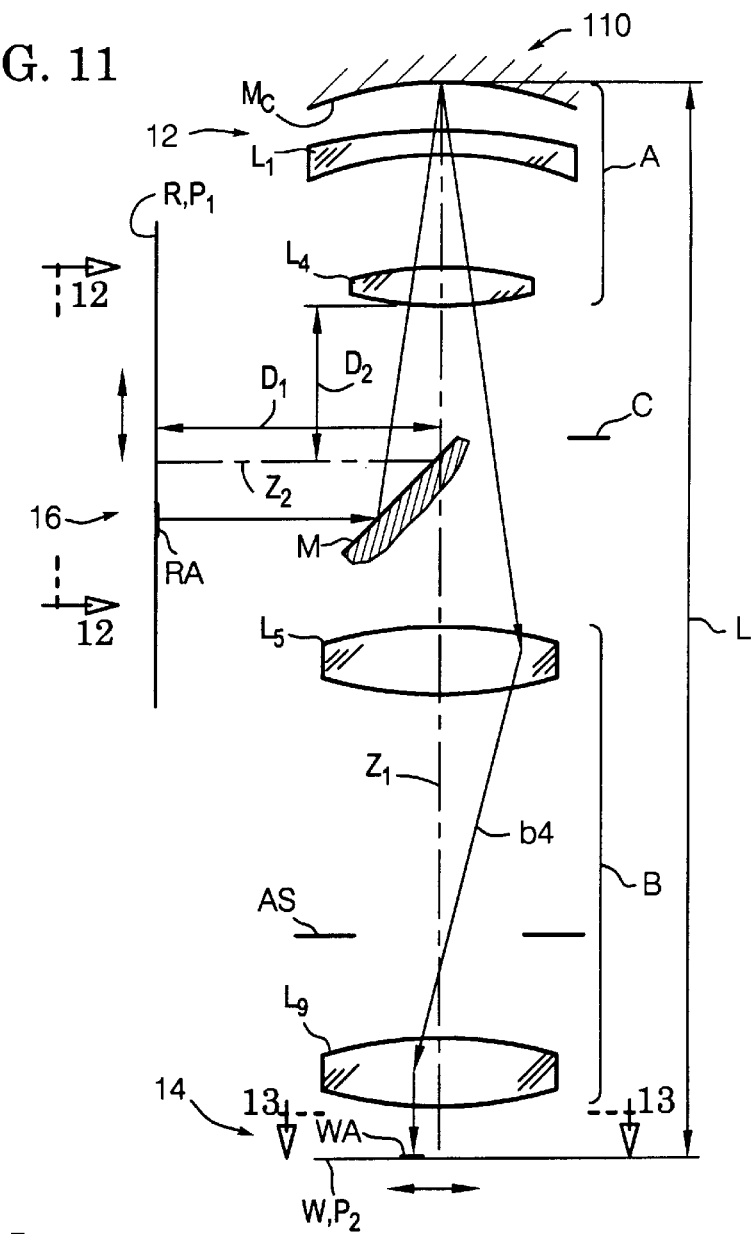
FIG. 11 is a schematic optical diagram of a second embodiment of the optical system of present invention.
Figure 12:
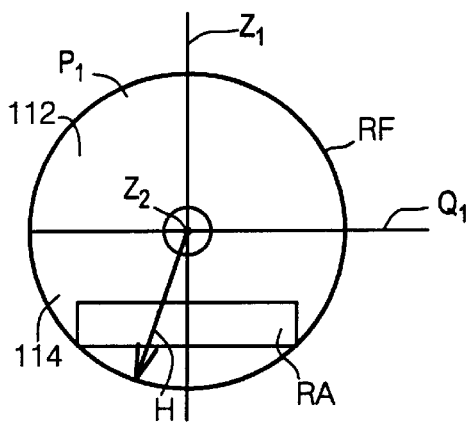
FIG. 12 is a diagram of the object field of the optical system of FIG. 11 taken along the cross-section 12—12.
Figure 13:
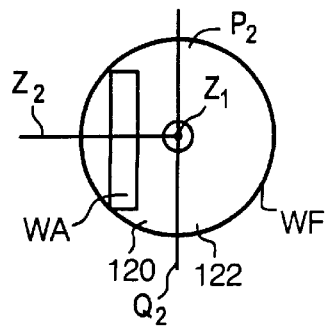
FIG. 13 is a diagram of the image field of the optical system of FIG. 11 taken along the cross-section 13—13.

Optical system 110 of FIG. 11 is similar to optical system 10 of FIG. 1, and represents a second embodiment of the present invention. In optical system 110, reflecting surface (i.e., light beam separating mirror) M is smaller than in Working Examples 1–3. Also, in optical system 110 and Working Examples 4–6 based thereon, the effective diameter of the optical system is small, at approximately ¾ that of refractive spherical optical systems normally used at the present specifications. In addition, the number of lenses is also small, being about half that of refractive spherical optical systems with similar specifications. Also, the lines of intersection $Q_1$ and $Q_2$ dividing the first and second regions 112,114 and 120,122 of first and second surfaces $P_1$ and $P_2$ respectively, are formed by a plane orthogonal to first optical axis $Z_1$ that includes second optical axis $Z_2$.

Figure 14:
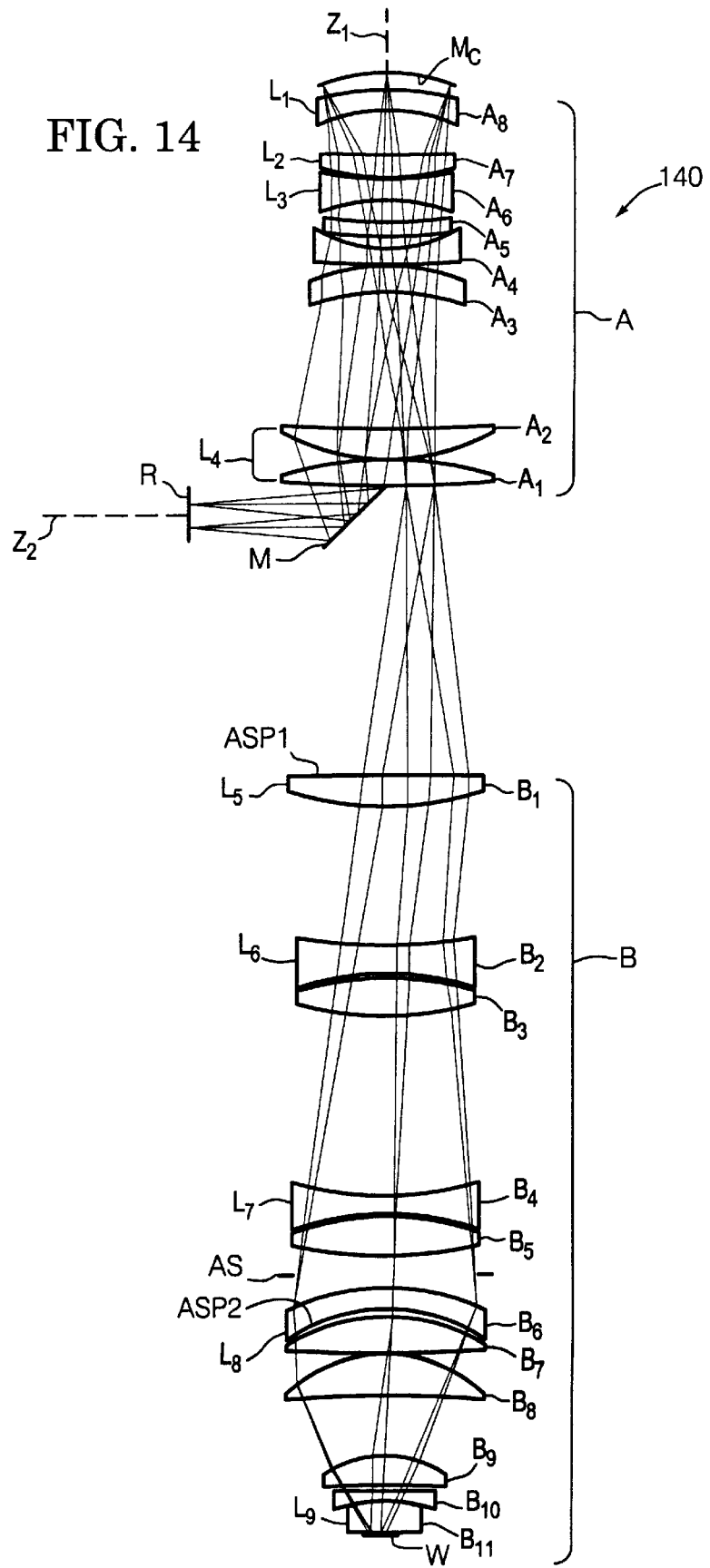
FIG. 14 is an optical path diagram of the optical system of Working Example 4 of the present invention.

With reference now to FIG. 14 and optical system 140 of Working Example 4, light beam separating mirror M is arranged after reticle R. In addition, first imaging optical system A comprises a round-trip optical system wherein, in order from the light beam separating mirror M side, two positive lenses A1 and A2, a meniscus lens A3, a negative meniscus lens A4, a positive lens A5, a negative lens A6, a positive lens A7, a negative meniscus lens A8 whose concave surface faces the light beam separating mirror M side, and concave mirror $M_C$.

Second imaging optical system B comprises, in order from the mirror M side, positive lens B1, negative lens B2, positive lens B3, negative lens B4, positive lens B5, aperture stop AS, meniscus lens B6, three positive lenses B7, B8 and B9, negative lens B10, and positive lens B11 whose convex surface faces the mirror M side.

TABLE 4A

SPECIFICATION OF OPTICAL MEMBERS

Principal Specifications:
$\lambda$ = 193 nm (ArF Excimer Laser)
$\beta$ = ¼  NA = 0.7
H = 70.36 mm  D = 160.1 mm  $D_2$ = 10.0 mm
L = 1534 mm  $\phi_{max}$ = 220 mm
Exposure Field: 25 × 6.6 mm
$|D_1/H|$ = 2.28  $|D_2/H|$ = 0.14  $|L/H|$ = 21.8

| S | r | d | E |  |
|---|---|---|---|---|
| 0 | ∞ | 160.100000 | R |  |
| 1 | ∞ | −10.000000 | M |  |
| 2 | −1788.71639 | −29.000000 | $A_1$ | $L_4$ |
| 3 | 419.30758 | −0.097200 |  |  |
| 4 | −250.61403 | −33.000000 | $A_2$ | $L_4$ |

TABLE 4A-continued

SPECIFICATION OF OPTICAL MEMBERS

| 5 | −6136.00339 | −138.422781 |  |  |
|---|---|---|---|---|
| 6 | 244.13129 | −27.000000 | $A_3$ |  |
| 7 | 236.86664 | −0.200000 |  |  |
| 8 | −441.03076 | −17.000000 | $A_4$ |  |
| 9 | −130.33902 | −13.232045 |  |  |
| 10 | −391.22278 | −19.000000 | $A_5$ |  |
| 11 | −4917.23961 | −18.600000 |  |  |
| 12 | 245.26287 | −17.000000 | $A_6$ | $L_3$ |
| 13 | −1615.89591 | −1.843450 |  |  |
| 14 | −241.95870 | −25.000000 | $A_7$ | $L_2$ |
| 15 | 14452.00549 | −62.163582 |  |  |
| 16 | 145.04293 | −18.000000 | $A_8$ | $L_1$ |
| 17 | 347.29355 | −19.661891 |  |  |
| 18 | 248.23614 | 19.661891 | $M_C$ |  |
| 19 | 347.29355 | 18.000000 | $A_8$ |  |
| 20 | 145.04293 | 62.163582 |  |  |
| 21 | 14452.00549 | 25.000000 | $A_7$ |  |
| 22 | −241.95870 | 1.843450 |  |  |
| 23 | −1615.89591 | 17.000000 | $A_6$ |  |
| 24 | 245.26287 | 18.600000 |  |  |
| 25 | −4917.23957 | 19.000000 | $A_5$ |  |
| 26 | −391.22278 | 13.232045 |  |  |
| 27 | −130.33902 | 17.000000 | $A_4$ |  |
| 28 | −441.03076 | 0.200000 |  |  |
| 29 | 236.86664 | 27.000000 | $A_3$ |  |
| 30 | 244.13129 | 138.422781 |  |  |
| 31 | −6136.00339 | 33.000000 | $A_2$ |  |
| 32 | −250.61403 | 0.097200 |  |  |
| 33 | 419.30758 | 29.000000 | $A_1$ |  |
| 34 | −1788.71639 | 291.668555 |  |  |
| *35 | 8637.19547 | 32.000000 | $B_1$ | $L_5$ |
| 36 | −278.32248 | 120.501173 |  |  |
| 37 | −284.21267 | 21.000000 | $B_2$ | $L_6$ |
| 38 | 380.00000 | 7.640330 |  |  |
| 39 | 977.55302 | 45.000000 | $B_3$ |  |
| 40 | −289.72006 | 188.674290 |  |  |
| 41 | −782.07989 | 24.000000 | $B_4$ |  |
| 42 | 275.00000 | 2.199165 |  |  |
| 43 | 311.81819 | 56.000000 | $A_5$ | $L_7$ |
| 44 | −375.13741 | 11.588720 |  |  |
| 45 | — | 10.000000 | AS |  |
| 46 | 196.65458 | 25.000000 | $B_6$ | $L_8$ |
| *47 | 180.51391 | 10.087193 |  |  |
| 48 | 253.87648 | 40.000000 | $B_7$ |  |
| 49 | 8600.70931 | 2.214198 |  |  |
| 50 | 157.11074 | 48.000000 | $B_8$ |  |
| 51 | 1256.41165 | 55.106219 |  |  |
| 52 | 113.93043 | 33.0000000 | $B_9$ |  |
| 53 | 886.99217 | 8.485632 |  |  |
| 54 | −18818.69933 | 12.000000 | $B_{10}$ |  |
| 55 | 207.40711 | 0.100000 |  |  |
| 56 | 109.31199 | 45.000000 | $B_{11}$ | $L_9$ |
| 57 | 14193.19706 | 6.000000 |  |  |
| 58 | ∞ |  | W |  |

TABLE 4B

ASPHERICAL SURFACE DATA

| S35 | A = | $-0.123690 \times 10^{-7}$ | B = | $0.129803 \times 10^{-13}$ |
|---|---|---|---|---|
|  | C = | $-0.212874 \times 10^{-18}$ | D = | $-0.943396 \times 10^{-22}$ |
| S47 | A = | $0.136582 \times 10^{-7}$ | B = | $0.193143 \times 10^{-12}$ |
|  | C = | $0.306903 \times 10^{-17}$ | D = | $0.487055 \times 10^{-22}$ |

Figure 16:
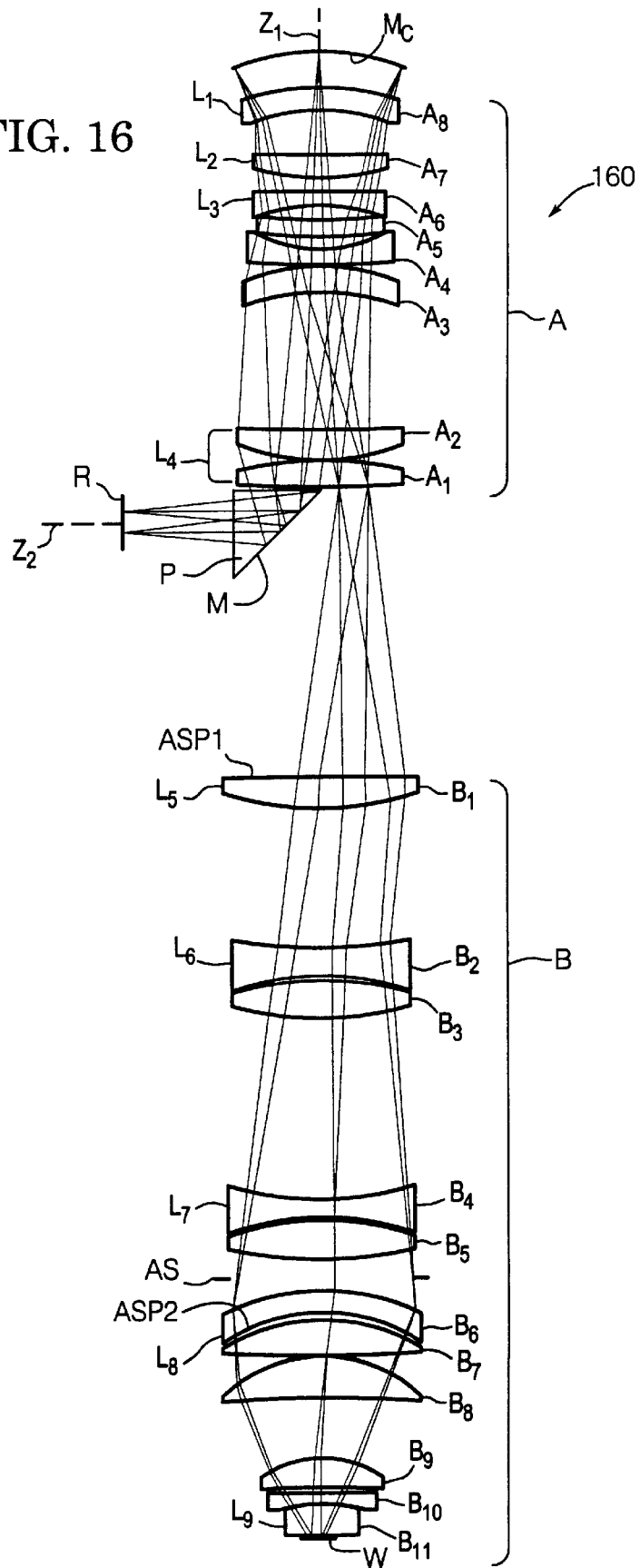
FIG. 16 is an optical path diagram of the optical system of Working Example 5 of the present invention.

With reference now to FIG. 16 and optical system 160 of Working Example 5, a light beam separating prism P is arranged after reticle R. In addition, first imaging optical system A comprises a round-trip optical system wherein, in order from the light beam separating prism P side, two positive lenses A1 and A2, a meniscus lens A3, a negative meniscus lens A4, a positive lens A5, a negative lens A6, a positive lens A7, a negative meniscus lens A8 whose concave surface faces the light beam separating prism P side, and concave mirror $M_C$.

Second imaging optical system B comprises, in order from the light beam separating prism P side, a positive lens B1, a negative lens B2, a positive lens B3, a negative lens B4, a positive lens B5, aperture stop AS, a meniscus lens B6, three positive lenses B7, B8 and B9, a negative lens B10, and a positive lens B11 whose convex surface faces the light beam separating prism P side.

TABLE 5A

DESIGN SPECIFICATION

Principal Specifications: $\lambda = 193$ nm (ArF Excimer Laser)
$\beta = \frac{1}{4}$     NA = 0.75
H = 70.36 mm     D = 190.1 mm     $D_2 = 20.0$ mm
L = 1693 mm     $\varnothing_{max} = 234$ mm
Exposure Field: 25 × 6.6 mm
|D/H| = 2.70     |$D_2$/H| = 0.28     |L/H| = 24.1

| S | r | d | E | |
|---|---|---|---|---|
| 0 | ∞ | 85.100000 | R | |
| 1 | ∞ | 105.000000 | P | |
| 2 | ∞ | −15.000000 | PM | |
| 3 | ∞ | −5.000000 | | |
| 4 | −1788.71639 | −29.000000 | $A_1$ | $L_4$ |
| 5 | 419.30758 | −0.097200 | | |
| 6 | −310.64095 | −33.000000 | $A_2$ | $L_4$ |
| 7 | −2807.83665 | −152.548704 | | |
| 8 | 287.16506 | −27.000000 | $A_3$ | |
| 9 | 255.48240 | −0.200000 | | |
| 10 | −367.14810 | −17.000000 | $A_4$ | |
| 11 | −141.19742 | −14.911131 | | |
| 12 | −398.90704 | −19.000000 | $A_5$ | |
| 13 | −608.94218 | −18.600000 | | |
| 14 | 232.39912 | −17.000000 | $A_6$ | $L_3$ |
| 15 | 1698.12647 | −15.952383 | | |
| 16 | −327.74499 | −25.000000 | $A_7$ | $L_2$ |
| 17 | 6237.96729 | −61.535574 | | |
| 18 | 166.40938 | −18.000000 | $A_8$ | $L_1$ |
| 19 | 395.75289 | −55.022688 | | |
| 20 | 301.44131 | 55.022688 | $M_C$ | |
| 21 | 395.75289 | 18.000000 | $A_8$ | |
| 22 | 166.40938 | 61.535574 | | |
| 23 | 6237.96729 | 25.000000 | $A_7$ | |
| 24 | −327.74499 | 15.952383 | | |
| 25 | 1698.12647 | 17.000000 | $A_6$ | |
| 26 | 232.39912 | 18.600000 | | |
| 27 | −608.94218 | 19.000000 | $A_5$ | |
| 28 | −398.90704 | 14.911131 | | |
| 29 | −141.19742 | 17.000000 | $A_4$ | |
| 30 | −367.14810 | 0.200000 | | |
| 31 | 255.48240 | 27.000000 | $A_3$ | |
| 32 | 287.16506 | 152.548704 | | |
| 33 | −2807.83665 | 33.000000 | $A_2$ | |
| 34 | −310.64095 | 0.097200 | | |
| 35 | 419.30758 | 29.000000 | $A_1$ | |
| 36 | −1788.71639 | 303.707152 | | |
| *37 | −20585.21661 | 32.000000 | $B_1$ | $L_5$ |
| 38 | −292.08517 | 141.774594 | | |
| 39 | −331.57665 | 21.000000 | $B_2$ | $L_6$ |
| 40 | 380.00000 | 6.239286 | | |
| 41 | 615.03205 | 45.000000 | $B_3$ | |
| 42 | −350.96686 | 195.254624 | | |
| 43 | −860.60392 | 24.000000 | $B_4$ | |
| 44 | 277.65121 | 2.310597 | | |
| 45 | 304.34780 | 56.000000 | $B_5$ | $L_7$ |
| 46 | −515.18847 | 46.552459 | | |
| 47 | — | 18.195879 | AS | |
| 48 | 226.73175 | 25.000000 | $B_6$ | $L_8$ |
| *49 | 231.03852 | 11.577787 | | |
| 50 | 282.73561 | 40.000000 | $B_7$ | |
| 51 | −1674.49168 | 4.412329 | | |
| 52 | 169.98274 | 48.000000 | $B_8$ | |
| 53 | 1665.64536 | 63.416012 | | |
| 54 | 124.88297 | 33.000000 | $B_9$ | |
| 55 | 711.33878 | 8.237993 | | |
| 56 | 2405.86425 | 12.000000 | $B_{10}$ | |

TABLE 5A-continued

DESIGN SPECIFICATION

| | | | | |
|---|---|---|---|---|
| 57 | 164.17050 | 0.100000 | | |
| 58 | 117.66988 | 45.000000 | $B_{11}$ | $L_9$ |
| 59 | 1593.84226 | 6.000000 | | |
| 60 | ∞ | | W | |

TABLE 5B

ASPHERICAL SURFACE DATA

| | | | | |
|---|---|---|---|---|
| S37 | A = | −0.888458 × 10⁻⁸ | B = | 0.557250 × 10⁻¹⁴ |
| | C = | −0.314040 × 10⁻¹⁸ | D = | −0.462916 × 10⁻²² |
| S49 | A = | 0.168833 × 10⁻⁷ | B = | 0.172714 × 10⁻¹² |
| | C = | 0.225018 × 10⁻¹⁷ | D = | 0.368469 × 10⁻²² |

Figure 18:
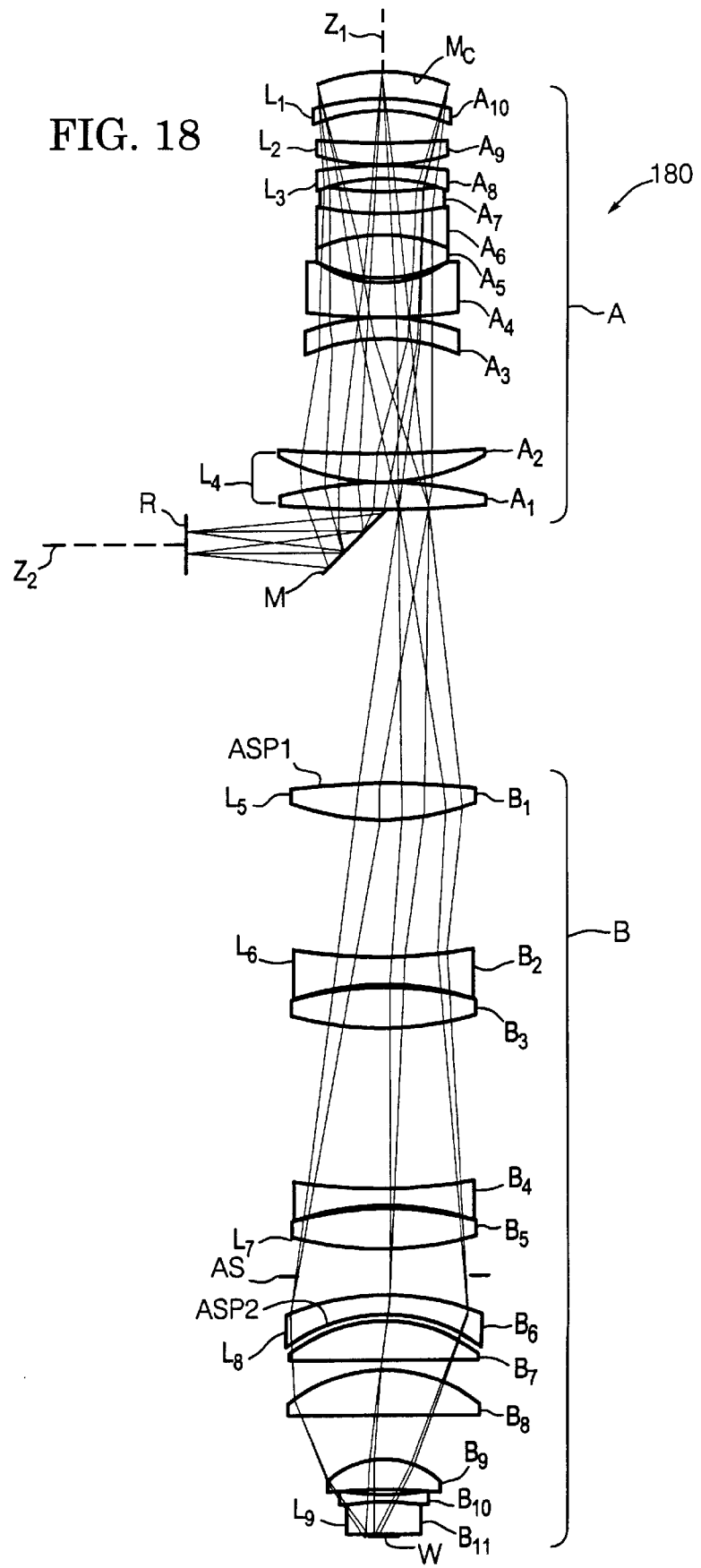
FIG. 18 is an optical path diagram of the optical system of Working Example 6 of the present invention.

With reference now to FIG. 18 and optical system 180 of Working Example 6, light beam seperated mirror M is arranged after reticle R. In addition, first imaging optical system A comprises a round-trip optical system wherein, in order from the light beam separating mirror M side, two positive lenses $A_1$ and $A_2$, a meniscus lens $A_3$, a negative meniscus lens $A_4$, a positive lens $A_5$, a negative lens $A_6$, a positive lens $A_7$, a negative lens $A_8$, a positive lens $A_9$, a negative meniscus lens $A_{10}$ whose concave surface faces the light beam separating mirror M side, and concave mirror $M_C$ are arranged.

Second imaging optical system B comprises, in order from the mirror M side, a positive lens $B_1$, a negative lens $B_2$, a positive lens $B_3$, a negative lens $B_4$, a positive lens $B_5$, an aperture stop AS, a meniscus lens $B_6$, three positive lenses $B_7$, $B_8$ and $B_9$, a negative lens $B_{10}$, and a positive lens B whose convex surface faces the light beam separating mirror M side.

TABLE 6A

DESIGN SPECIFICATION

Principal Specifications: $\lambda = 193$ nm
(ArF Excimer Laser)
$\beta = \frac{1}{4}$     NA = 0.8
H = 70.36 mm     D = 176.0 mm     $D_2 = 20.0$ mm
L = 1731 mm     $\varnothing_{max} = 246$ mm
Exposure Field: 25 × 6.6 mm
|D/H| = 2.50     |$D_2$/H| = 0.28     |L/H| = 24.6

| S | r | d | E | |
|---|---|---|---|---|
| 0 | ∞ | 176.024677 | R | |
| 1 | ∞ | −20.000000 | M | |
| 2 | −1788.71639 | −33.000000 | $A_1$ | $L_4$ |
| 3 | 419.30758 | −0.097200 | | |
| 4 | −268.74569 | −40.000000 | $A_2$ | $L_4$ |
| 5 | −3732.51475 | −132.767922 | | |
| 6 | 239.37693 | −27.000000 | $A_3$ | |
| 7 | 244.82836 | −0.216094 | | |
| 8 | −2548.31604 | −25.000000 | $A_4$ | |
| 9 | −143.32698 | −8.449526 | | |
| 10 | −204.90390 | −45.000000 | $A_5$ | |
| 11 | −272.57153 | −0.100000 | | |
| 12 | 327.21563 | −17.000000 | $A_6$ | |
| 13 | −181.11096 | −5.571460 | | |
| 14 | −266.20425 | −25.000000 | $A_7$ | |
| 15 | −1015.69653 | −18.600000 | | |
| 16 | 194.20523 | −17.000000 | $A_8$ | $L_3$ |
| 17 | 997.00876 | −6.595016 | | |
| 18 | −338.50796 | −25.000000 | $A_9$ | $L_2$ |
| 19 | −3625.68572 | −29.822032 | | |
| 20 | 222.83295 | −18.000000 | $A_{10}$ | $L_1$ |

TABLE 6A-continued

DESIGN SPECIFICATION

| | | | | |
|---|---|---|---|---|
| 21 | 455.81520 | −42.796334 | | |
| 22 | 295.50430 | 42.796334 | $M_C$ | |
| 23 | 455.81520 | 18.000000 | $A_{10}$ | |
| 24 | 222.83295 | 29.822032 | | |
| 25 | −3625.68572 | 25.000000 | $A_9$ | |
| 26 | −338.50796 | 6.595016 | | |
| 27 | 997.00876 | 17.000000 | $A_8$ | |
| 28 | 194.20523 | 18.600000 | | |
| 29 | −1015.69652 | 25.000000 | $A_7$ | |
| 30 | −266.20425 | 5.571460 | | |
| 31 | −181.11096 | 17.000000 | $A_6$ | |
| 32 | 327.21563 | 0.100000 | | |
| 33 | 272.57153 | 45.000000 | $A_5$ | |
| 34 | −204.90390 | 8.449526 | | |
| 35 | −143.32698 | 25.000000 | $A_4$ | |
| 36 | −2458.31604 | 0.216094 | | |
| 37 | 244.82836 | 27.000000 | $A_3$ | |
| 38 | 239.37693 | 132.767922 | | |
| 39 | −3732.51475 | 40.000000 | $A_2$ | |
| 40 | −268.74569 | 0.097200 | | |
| 41 | 419.30758 | 33.000000 | $A_1$ | |
| 42 | −1788.71639 | 322.860627 | | |
| *43 | 1988.13960 | 40.000000 | $B_1$ | $L_5$ |
| 44 | −346.17707 | 118.096619 | | |
| 45 | −314.01518 | 21.000000 | $B_2$ | $L_6$ |
| 46 | 380.00000 | 7.483728 | | |
| 47 | 692.44628 | 45.000000 | $B_3$ | |
| 48 | −337.77571 | 215.989100 | | |
| 49 | −792.05453 | 24.000000 | $B_4$ | |
| 50 | 285.31369 | 2.593128 | | |
| 51 | 316.36067 | 56.000000 | $B_5$ | $L_7$ |
| 52 | −463.77046 | 38.289875 | | |
| 53 | — | 11.964033 | AS | |
| 54 | 233.30662 | 25.000000 | $B_6$ | $L_8$ |
| *55 | 234.22897 | 13.010023 | | |
| 56 | 255.52550 | 45.000000 | $B_7$ | |
| 57 | −2621.18382 | 12.423981 | | |
| 58 | 181.15092 | 55.000000 | $B_8$ | |
| 59 | 3385.66441 | 57.958719 | | |
| 60 | 120.24350 | 33.000000 | $B_9$ | |
| 61 | 683.24154 | 5.786488 | | |
| 62 | 1209.78340 | 12.000000 | $B_{10}$ | |
| 63 | 174.98798 | 0.101872 | | |
| 64 | 125.78514 | 45.000000 | $B_{11}$ | $L_9$ |
| 65 | 1885.85548 | 6.000000 | | |
| 66 | ∞ | | W | |

TABLE 6B

ASPLIERICAL SURFACE DATA

| | | |
|---|---|---|
| S43 | $A = -0.619385 \times 10^{-8}$ | $B = 0.120817 \times 10^{-13}$ |
| | $C = -0.197420 \times 10^{-18}$ | $D = -0.295727 \times 10^{-22}$ |
| S55 | $A = 0.174263 \times 10^{-7}$ | $B = 0.204171 \times 10^{-12}$ |
| | $C = 0.268111 \times 10^{-17}$ | $D = 0.477853 \times 10^{-22}$ |

As can from the aberration plots in FIGS. 15, 17 and 19 corresponding respectively to Working Examples 4, 5 and 6, excellent imaging performance at the unit wavelength of 193 nm is obtained and aberrations are correct to a nearly aberration-free state for each Working Example.

Although reflective surface M is used in Working Example 1 and Working Example 3 to seperate light beam b2 that proceeds to concave mirror $M_C$ and light beam b3 reflected from concave mirror $M_C$, reflective surface M may also be constructed as an apertured reflective mirror through which just reflected light beam b3 from concave mirror $M_C$ passes.

In addition, reflective surface M may also be constructed by combining a polarizing beam splitter and ¼ wavelength plate (not shown) so that the polarized light from reticle R is reflected and the polarized light from concave mirror $M_C$ passes through.

In the present invention as described above, an optical system that constitutes the imaging portion is arranged along a single optical axis, and the reflective surface for separating the light beams is arranged outside of the imaging optical system. Consequently, the entire optical system can be examined at the center of the optical axis, and the tilt and shift of each internal lens can be detected.

In other words, adjustment of the optical system is extremely difficult if the bending of the optical axis is performed inside an imaging optical system, However, in the present invention, adjustment of the optical system is extremely easy since the reflective surface that bends the optical path is arranged outside of the imaging optical systems A and B.

In addition, when the present invention is applied to a scanning-type exposure apparatus, the scanning direction of both the reticle and the wafer is the horizontal direction. Accordingly, it is unnecessary to compensate for the effects of gravity, and scanning is easy to control.

While the present invention has been described in connection with preferred embodiments and Working Examples, it will be understood that it is not so limited. On the contrary, it is intended to cover all alternatives, modifications and equivalents as may be included within the spirit and scope of the invention as defined in the appended claims.

What is claimed is:

1. A catadioptric optical system capable of forming an image of an object, comprising:

a) a first optical axis having a first end and a second end, with a concave mirror arranged at said first end, and a second surface orthogonal to said first optical axis at said second end;

b) a reflective surface arranged between said concave mirror and said second surface;

c) a first imaging optical system comprising a first plurality of lenses arranged between said reflective surface and said concave mirror;

d) a second imaging optical system comprising a second plurality of lenses arranged between said reflective surface and said second surface;

e) a second optical axis intersecting said first optical axis at said reflective surface and having a first surface disposed along and orthogonal to said second optical axis and removed from said reflective surface, said first surface being divided into first and second regions by a line of intersection between said first surface and a plane containing said first optical axis and said second optical axis;

f) wherein the object is arranged in one of said first and second regions of said first surface or first and second regions of said second surface, and the image is formed in one of said first and second regions of the opposite one of said first or said second surface, said first and second regions of said second surface being formed by dividing said second surface by a line of intersection between said second surface and the plane containing said first optical axis and said second optical axis; and g) wherein an intermediate image of the object is formed in the vicinity of said reflective surface.

2. A catadioptric optical system according to claim 1, satisfying the following conditions:

$0.8 < |D_1/H| < 3$ $20 < |L/H| < 30$ wherein H is a maximum height of the object as measured from said second optical axis, $D_1$ is a distance along said secondary optical axis from said first surface to the reflective surface, and L is the distance along said first optical axis from said concave mirror to said second surface.

3. A catadioptric optical system according to claim 2, satisfying the following condition:

$|D_2/H| < 2.5$ wherein $D_2$ is a distance along said first optical axis toward said concave mirror from said reflective surface to a lens surface closest to said reflective surface.

4. A catadioptric optical system according to claim 2, wherein said first imaging optical system includes, in order along said first optical axis from said concave mirror side, at least a negative meniscus lens and a positive lens.

5. A catadioptric optical system according to claim 4, wherein said first optical imaging system further includes, in order along said first optical axis from said concave mirror side, at least a positive lens $L_2$ and a negative lens $L_3$ between said negative meniscus lens $L_1$ and positive lens $L_4$.

6. A catadioptric optical system according to claim 1, satisfying the following condition:

$|D_2/H| < 2.5$ wherein $D_2$ is a distance along said first optical axis toward said concave mirror from said reflective surface to a lens surface closest to said reflective surface, and H is a maximum height of the object as measured from said second optical axis.

7. A catadioptric optical system according to claim 1, wherein said first imaging optical system includes, in order along said first optical axis from said concave mirror side, at least a negative meniscus lens and a positive lens.

8. A catadioptric optical system according to claim 7, wherein said first optical imaging system further includes, in order along said first optical axis from said concave mirror side, at least a positive lens $L_2$ and a negative lens $L_3$ between said negative meniscus lens $L_1$ and positive lens $L_4$.

9. A catadioptric optical system according to claim 7, wherein said second imaging optical system includes an aperture stop, at least a positive lens $L_7$ in the vicinity of said aperture stop, and at least a positive lens $L_9$ whose convex surface faces said reflective surface and which is immediately adjacent said second surface.

10. A catadioptric optical system according to claim 1, wherein said second imaging optical system includes an aperture stop, at least a positive lens $L_7$ in the vicinity of said aperture stop, and at least a positive lens $L_9$ whose convex surface faces said reflective surface and which is immediately adjacent said second surface.

11. A catadioptric optical system according to claim 10, wherein said second imaging optical system includes at least a positive lens $L_5$ after said reflective surface, at least a positive lens $L_7$ and a meniscus lens $L_8$ provided in the vicinity of said aperture stop, and at least a positive lens $L_9$ whose convex surface faces said reflective surface is provided immediately adjacent said second surface.

12. A catadioptric optical system according to claim 1, including at least two or more aspherical lens surfaces.

13. A catadioptric optical system according to claim 1, wherein said lenses in said first and second plurality of lenses are formed of the same glass material.

* * * * *